(12) United States Patent
Fremrot et al.

(10) Patent No.: US 12,733,134 B2
(45) Date of Patent: Sep. 8, 2026

(54) COMBINED POWER/FAN COOLING SYSTEM

(71) Applicant: Dell Products L.P., Round Rock, TX (US)

(72) Inventors: Per Henrik Fremrot, Novato, CA (US); Colin Montgomery, Mountain View, CA (US); Maunish Shah, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 296 days.

(21) Appl. No.: 18/658,099

(22) Filed: May 8, 2024

(65) Prior Publication Data

US 2025/0351307 A1 Nov. 13, 2025

(51) Int. Cl.
*H05K 7/20* (2006.01)

(52) U.S. Cl.
CPC ..... *H05K 7/20727* (2013.01); *H05K 7/20172* (2013.01)

(58) Field of Classification Search
CPC ........... H05K 7/20172; H05K 7/20727; H05K 7/1492; H05K 7/2019; H05K 7/20718; H05K 7/20909; G06F 1/20; F04D 29/646; F04D 25/166
See application file for complete search history.

(56) References Cited

U.S. PATENT DOCUMENTS

| | | | | |
|---|---|---|---|---|
| 6,604,916 | B2 * | 8/2003 | Lu | H05K 7/20581 361/695 |
| 10,729,037 | B1 * | 7/2020 | Shearman | H04Q 1/035 |
| 2004/0256334 | A1 * | 12/2004 | Chen | H05K 7/20727 211/41.17 |
| 2010/0110632 | A1 * | 5/2010 | Rose | H05K 7/20727 361/695 |
| 2017/0086332 | A1 * | 3/2017 | Jaskela | H05K 7/1487 |
| 2018/0070473 | A1 * | 3/2018 | Zhang | G06F 1/181 |
| 2025/0287545 | A1 * | 9/2025 | Narayanan | G06F 1/185 |

* cited by examiner

*Primary Examiner* — Mandeep S Buttar
(74) *Attorney, Agent, or Firm* — Joseph Mencher

(57) ABSTRACT

A combined power/fan cooling system includes a power/fan chassis that may be provided in a computing device. A power subsystem housed in the power/fan chassis receives power from a power source when the power/fan chassis is provided in the computing device, and provides the power to component(s) in the computing device. A fan subsystem located in the power/fan chassis adjacent the power subsystem includes fan devices that generate an airflow past the power subsystem and the component(s) in the computing device when the power/fan chassis is provided in the computing device. Each of the fan devices is also configured to be connected to, and disconnected from, the power subsystem while the power subsystem is providing the power to the component(s) in the computing device.

20 Claims, 23 Drawing Sheets

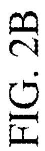
FIG. 2B
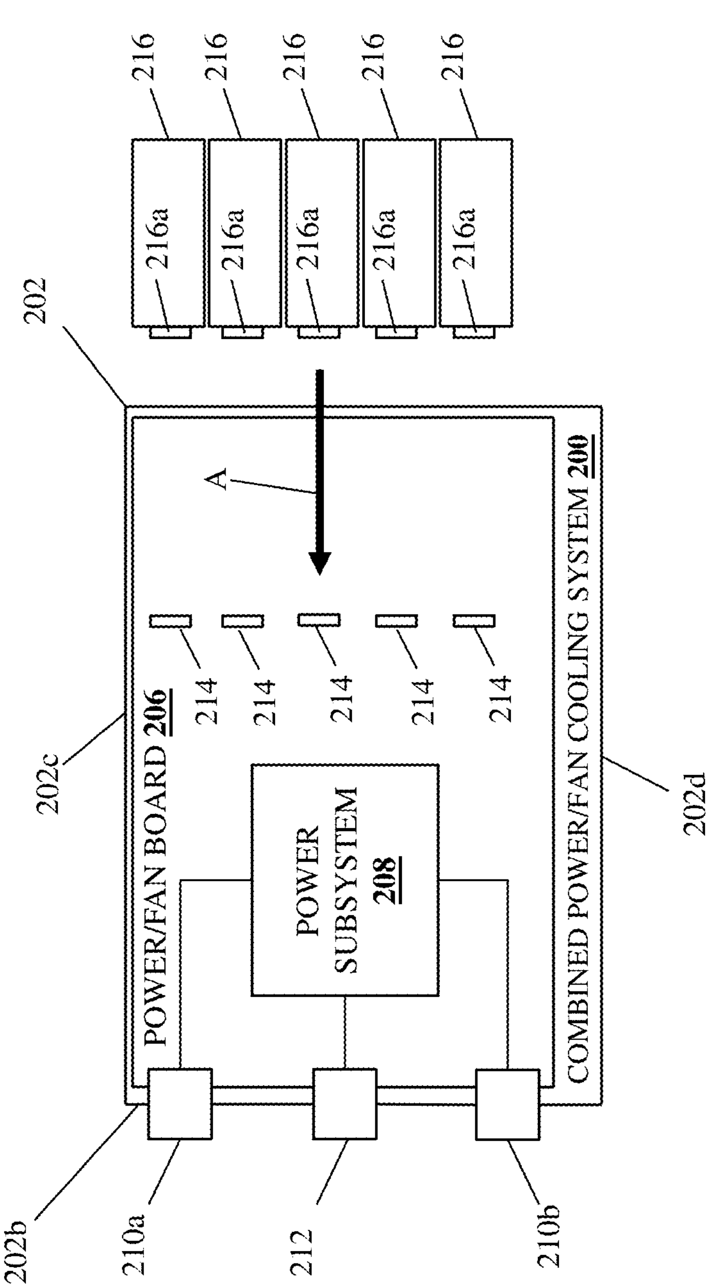

416a
402b
416b 404a
404b
402d
402c
412a
410a
410b
412b
NETWORKING BOARD 406
NETWORKING ENGINE 408
NETWORKING DEVICE 400
402
402a

COMBINED POWER/FAN COOLING SYSTEM

BACKGROUND

The present disclosure relates generally to information handling systems, and more particularly to powering and cooling information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, networking devices (e.g., switch devices) continue to consume more and more power as the bandwidth of those networking devices is increased (e.g., power consumption increases 30-40% each time bandwidth is doubled), and as power consumption and corresponding heat production increases, conventional cooling infrastructures used for such networking devices struggle to meet the cooling requirements of those networking devices. While some networking device users are beginning to implement liquid cooling systems, liquid immersion systems, and other relatively higher heat transfer cooling systems known in the art, such "exotic" cooling systems increase the costs and complexity of cooling those networking devices.

Accordingly, it would be desirable to provide a cooling system that addresses the issues discussed above.

SUMMARY

According to one embodiment, an Information Handling System (IHS) includes a networking device chassis; a processing system that is housed in the networking device chassis; a memory system that is housed in the networking device chassis, that is coupled to the processing system, and that includes instructions that, when executed by the processing system, cause the processing system to provide a networking engine; a first power/fan chassis that is housed in the networking device chassis; a first power subsystem that is housed in the first power/fan chassis, that is coupled to a first power source via a first power source connector included in the networking device chassis, and that provides first power from the first power source to the processing system and the memory system; and a first fan subsystem that is housed in the first power/fan chassis adjacent the first power subsystem and that includes a plurality of first fan devices that are each configured to generate a first airflow past the first power subsystem, the processing system, and the memory system, and wherein each of the plurality of first fan devices is configured to be connected to, and disconnected from, the first power subsystem while the first power subsystem is providing the first power to the processing system and the memory system.

BRIEF DESCRIPTION OF THE DRAWINGS

FIG. 2B is a schematic view illustrating an embodiment of fan devices being coupled to the combined power/fan cooling system of FIG. 2A.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
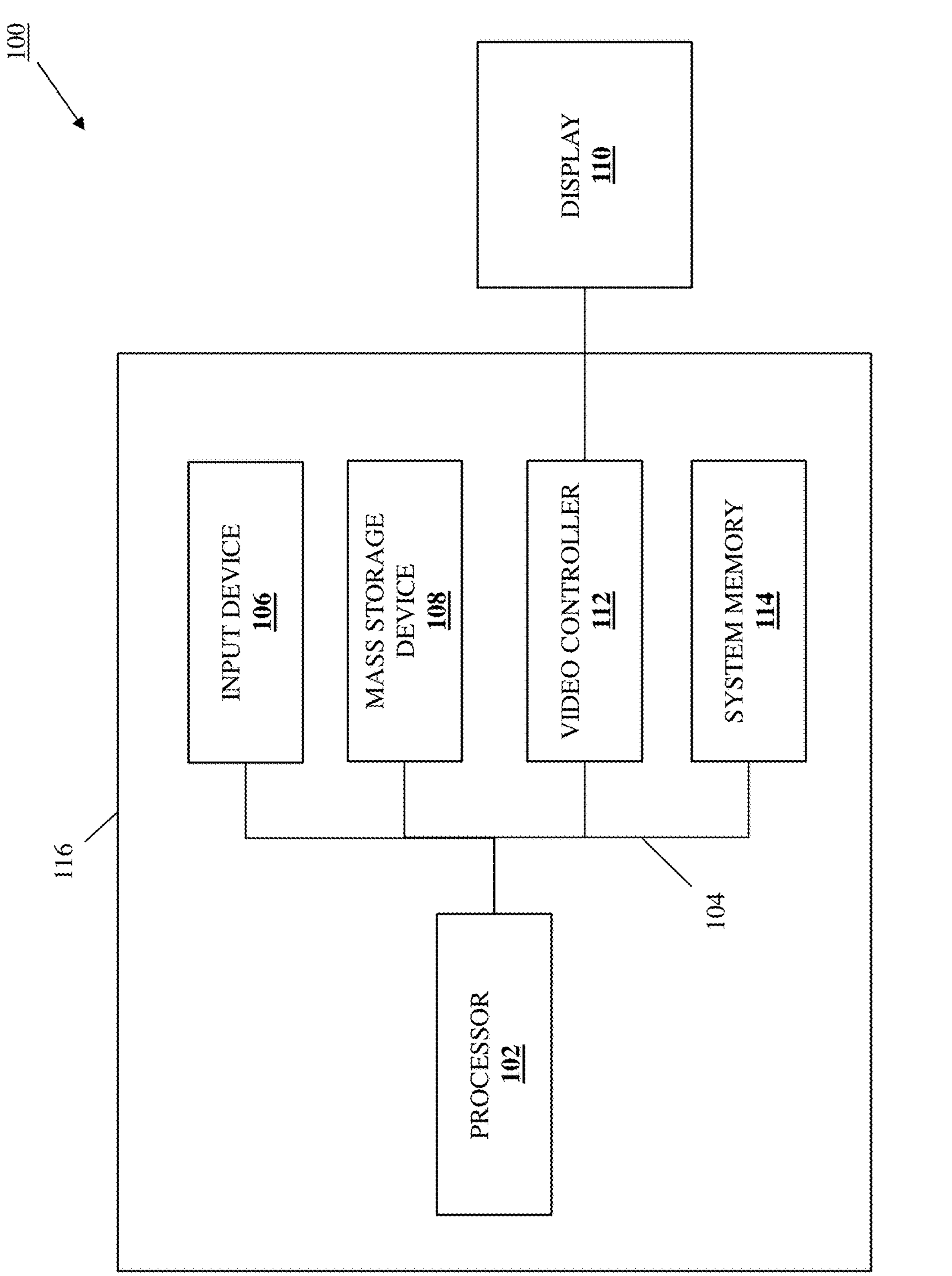
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
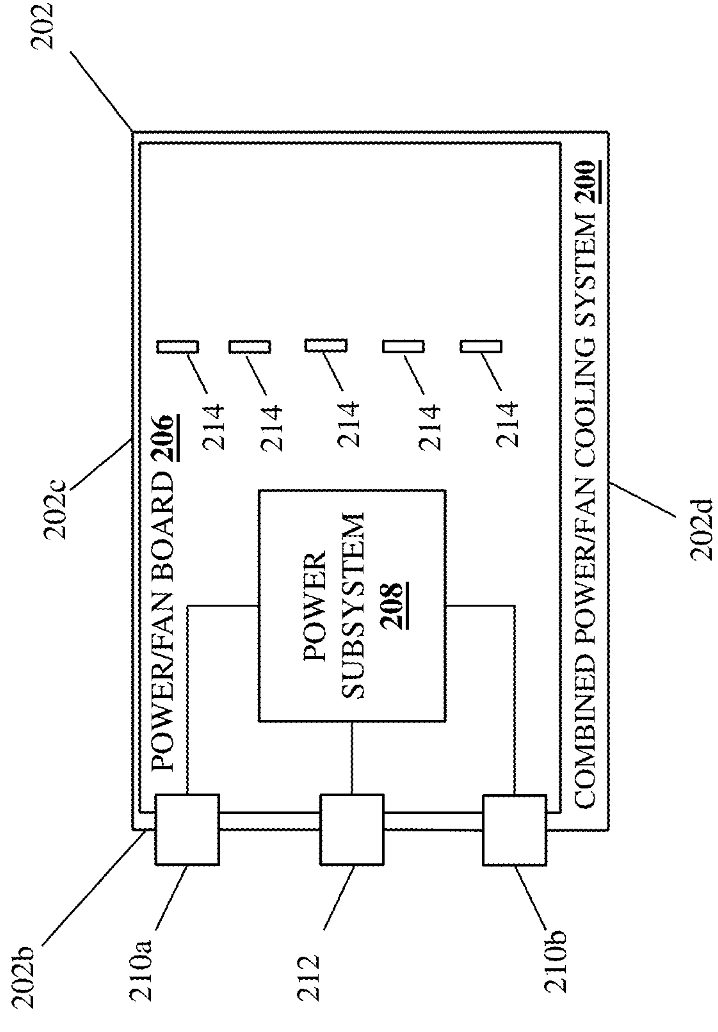
FIG. 2A is a schematic view illustrating an embodiment of a combined power/fan cooling system provided according to the teachings of the present disclosure.
Figure 2C:
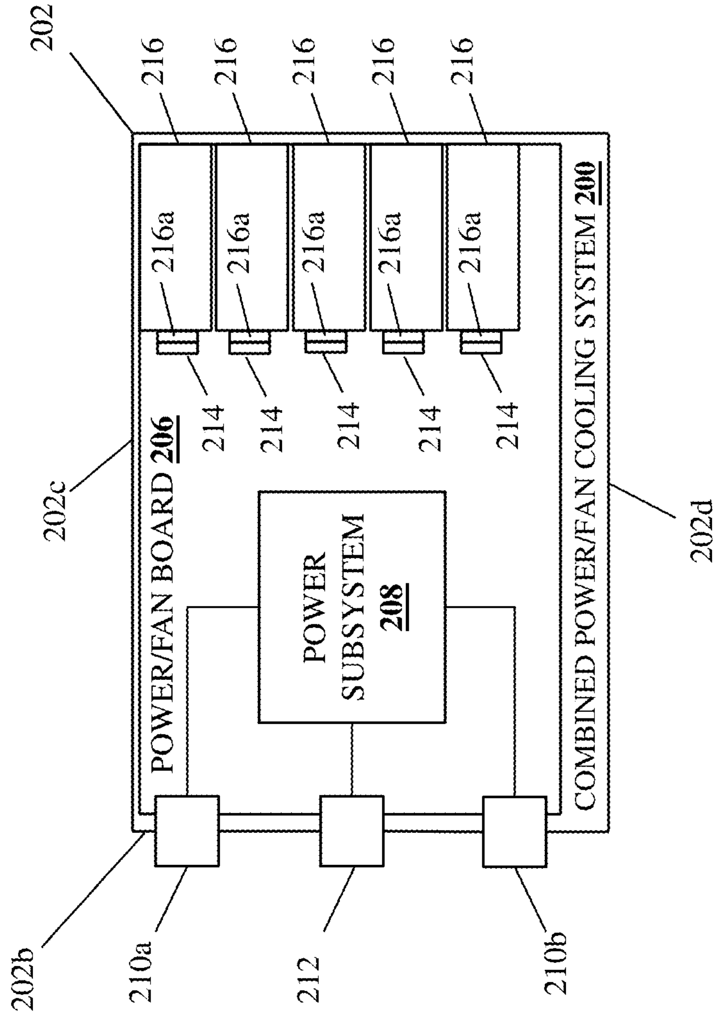
FIG. 2C is a schematic view illustrating an embodiment of fan devices coupled to the combined power/fan cooling system of FIG. 2A.
Figure 2D:
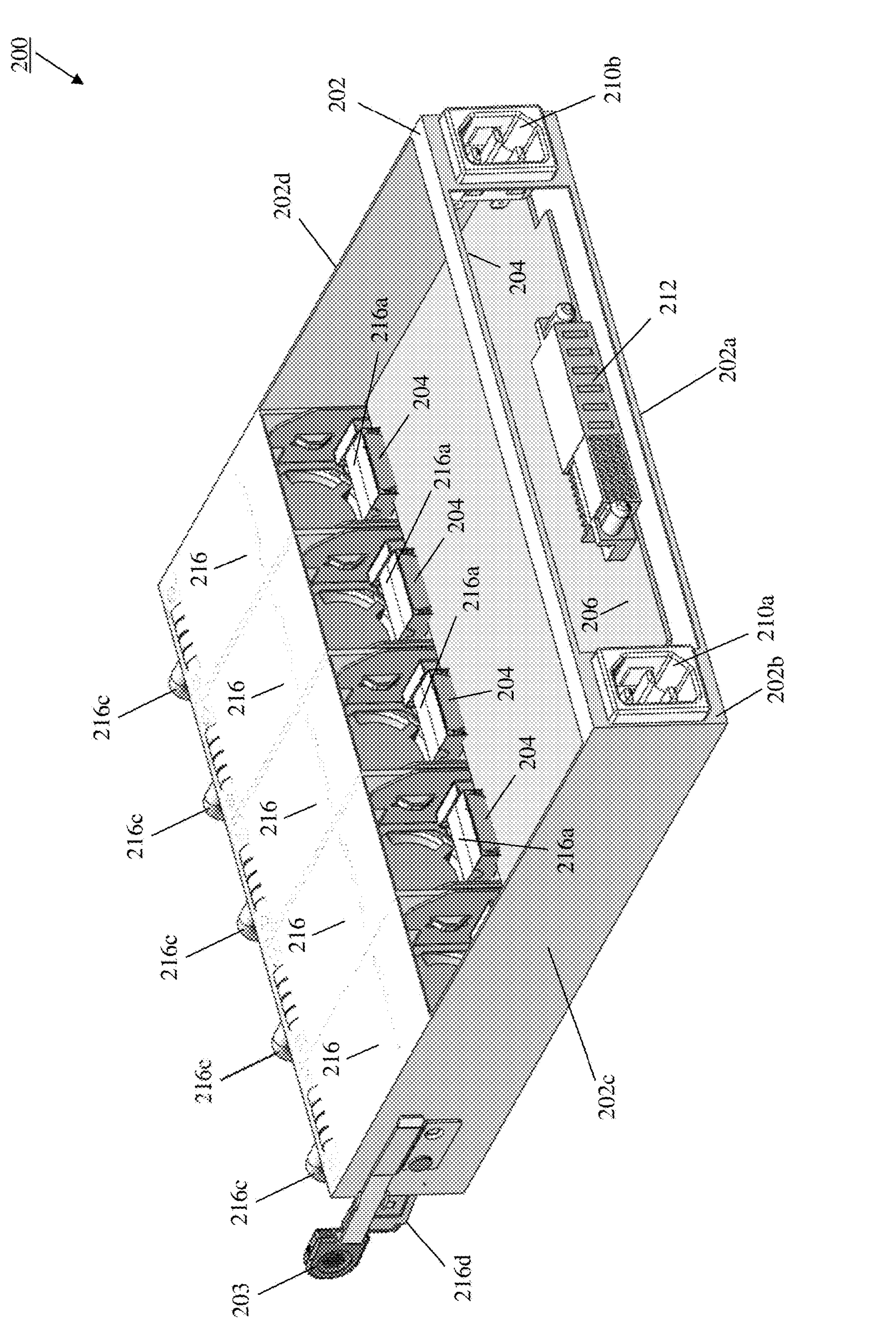
FIG. 2D is a front perspective view illustrating and embodiment of the combined power fan cooling system of FIG. 2C.
Figure 2E:
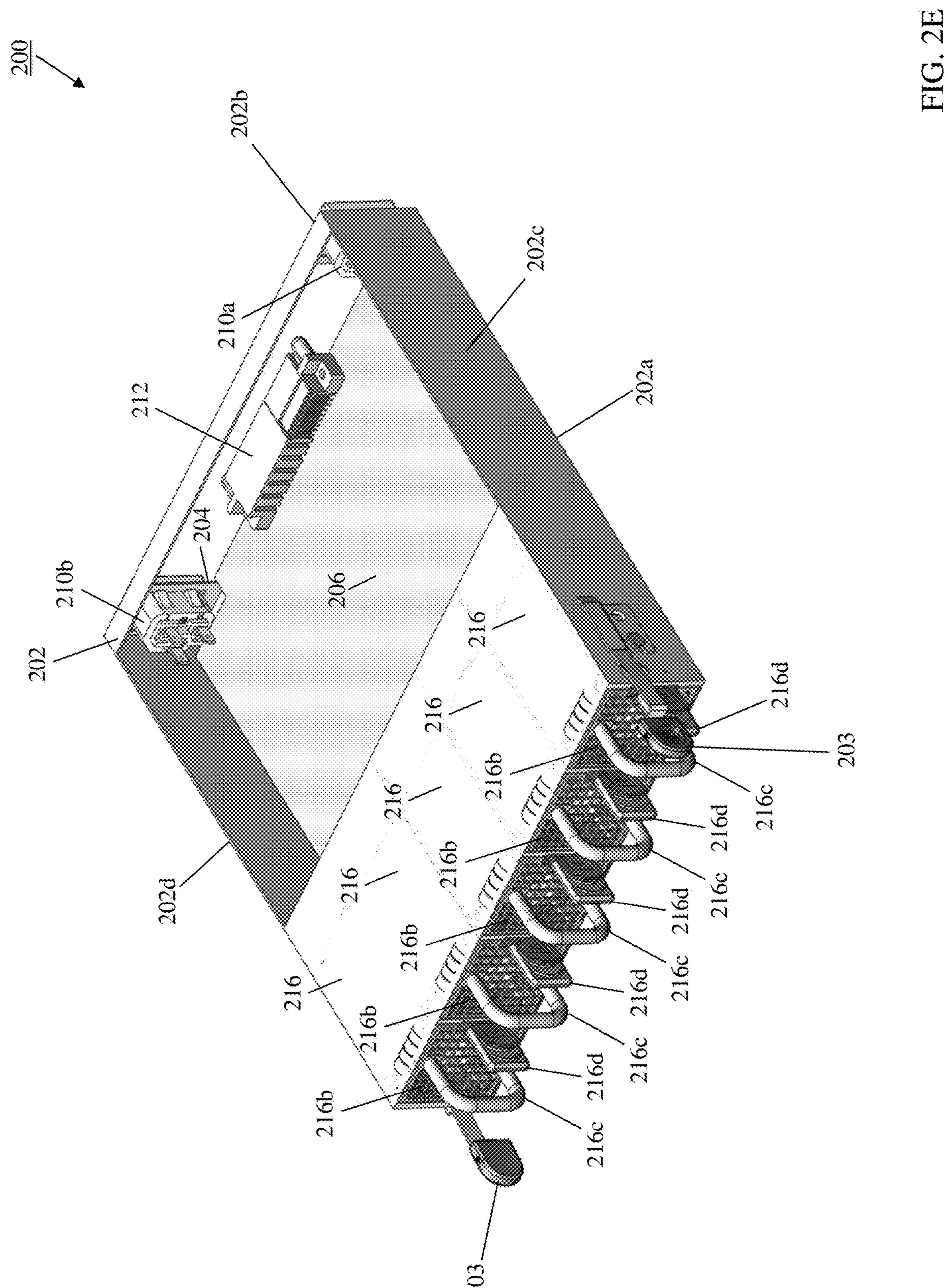
FIG. 2E is a rear perspective view illustrating and embodiment of the combined power fan cooling system of FIG. 2C.

Referring now to FIGS. 2A, 2B, 2C, 2D, and 2E, an embodiment of a combined power/fan cooling system 200 is illustrated that may be provided according to the teachings of the present disclosure. In the illustrated embodiment, the combined power/fan cooling system 200 includes a power/fan chassis 202 that houses the components of the combined power/fan cooling system 200, only some of which are illustrated and described below. As can be seen in FIGS. 2D and 2E, the power/fan chassis 202 includes a bottom wall 202*a*, a front wall 202*b* that extends from the bottom wall 202*a*, and a pair of opposing side walls 202*c* and 202*d* that extend between the bottom wall 202*a* and the front wall 202*b* opposite the power/fan chassis 202 from each other. As can be seen in FIGS. 2D and 2E, a front airflow aperture 204 may be defined by the front wall 202*a* of the chassis, and one of skill in the art in possession of the present disclosure will appreciate how the bottom wall 202*a* and the side walls 202*c* and 202*d* may define a rear airflow channel opposite the power/fan chassis 202 from the airflow aperture 204. Furthermore, FIGS. 2D and 2E illustrate how a pair of release members 203 may extend from the side walls 202*c* and 202*d*, respectively, and on opposite sides of the rear airflow channel.

In the illustrated embodiment, a power/fan board 206 is provided in the power/fan chassis 202 and may be mounted to the bottom wall 202*a* of the power/fan chassis 202. As can be seen in FIGS. 2A, 2B, and 2C (while not illustrated in FIGS. 2D and 2E for clarity), a power subsystem 208 may be mounted to the power/fan board 206, and may be provided by a Power Supply Unit (PSU), a power controller, and/or any other power components that would be apparent to one of skill in the art in possession of the present disclosure. As can be seen in the embodiments illustrated in FIGS. 2A-2E, a pair of power source connectors 210*a* and 210*b* (e.g., Alternating Current (AC) power connectors) may be provided on opposite sides of the front wall 202*b* of the power/fan chassis 202 adjacent the side walls 202*c* and 202*d*, respectively, with one of those power source connectors providing connection to a power source when the power/fan chassis 202 is provided in different power/fan chassis slots in a computing device as described in further detail below. As can be seen in FIGS. 2A, 2B, and 2C (while not illustrated in FIGS. 2D and 2E for clarity), the power source connectors 210*a* and 210*b* may be coupled to the power subsystem 208 via, for example, traces in the power/fan board 206, cabling, and/or other power couplings that would be apparent to one of skill in the art in possession of the present disclosure.

As can also be seen in the embodiments illustrated in FIGS. 2A-2E, a component connector 212 (e.g., a Direct Current (DC) power connector) may be provided adjacent the airflow aperture 204 defined by the front wall 202*b* of the power/fan chassis 202 and between the power source connectors 210*a* and 210*b*, and as described below is configured to connect to a networking board or other component in a computing device when the power/fan chassis 202 is provided in different power/fan chassis slots in a computing device. As can be seen in FIGS. 2A, 2B, and 2C (while not illustrated in FIGS. 2D and 2E for clarity), the component connector 212 may be coupled to the power subsystem 208 via, for example, traces in the power/fan board 206 and/or other component couplings that would be apparent to one of skill in the art in possession of the present disclosure.

As can be seen in FIGS. 2A-2E, a plurality of board connectors 214 may be mounted to the power/fan board 206, and while not illustrated, each of the board connectors 214 may be coupled (e.g., via the power/fan board 206) to the power subsystem 208, the component connectors 212, and/or any other subsystems in the combined power/fan cooling system 200 that one of skill in the art in possession of the present disclosure would recognize as enabling the functionality described below. In the specific examples illustrated and described below, five board connectors are provided in the combined power/fan cooling system 200, but one of skill in the art in possession of the present disclosure will appreciate how more (or fewer) board connectors may be utilized depending on the space available for the combined power/fan cooling system 200 in the computing device with which it is used.

As illustrated in FIGS. 2B-2E, a respective fan device 216 may be connected to each of the board connectors 214 by positioning that fan device 216 adjacent the airflow channel defined by the bottom wall 202*a* and the side walls 202*c* and 202*d* of the power/fan chassis 202 such that a fan connector 216*a* on that fan device 216 is aligned with one of the board connectors 214, and then moving that fan device 216 in a direction A such that the fan connector 216*a* on that fan device 216 engages that board connector 214. As will be appreciated by one of skill in the art in possession of the present disclosure, each of the fan devices 216 may include fans, motors, fan controller subsystems, and/or other fan components known in the art. Furthermore, as can be seen in FIG. 2E, each of the fan devices 216 may include a surface that is positioned adjacent the airflow channel defined by the bottom wall 202*a* and the side walls 202*c* and 202*d* of the power/fan chassis 202 when its fan connector 216*a* engages its board connector 214*a*, with airflow apertures 216*b* defined in that surface, a handle 216*c* extending from that surface, and a release member 216*d* extending from that surface (with that release member 216*d* engaging the power/fan chassis 202 to secure that fan device in the power/fan chassis 202). However, while a specific combined power/fan cooling system 200 has been illustrated and described, one of skill in the art in possession of the present disclosure will recognize that the combined power/fan cooling system of the present disclosure may include a variety of components and component configurations while remaining within the scope of the present disclosure as well.

Figure 3A:
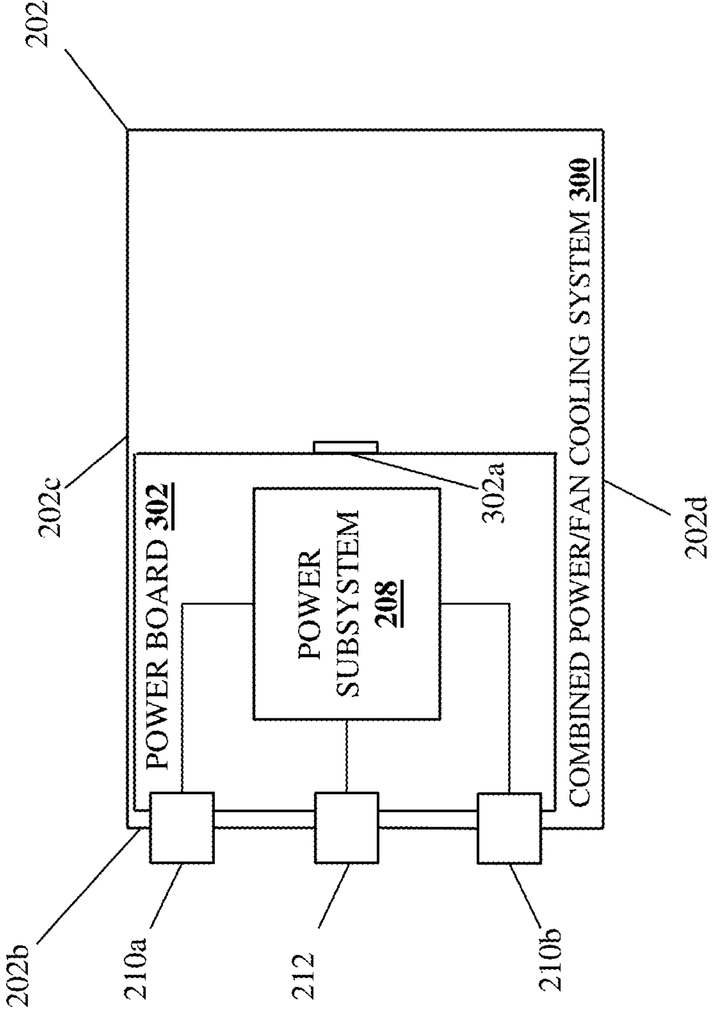
FIG. 3A is a schematic view illustrating an embodiment of a combined power/fan cooling system provided according to the teachings of the present disclosure.
Figure 3B:
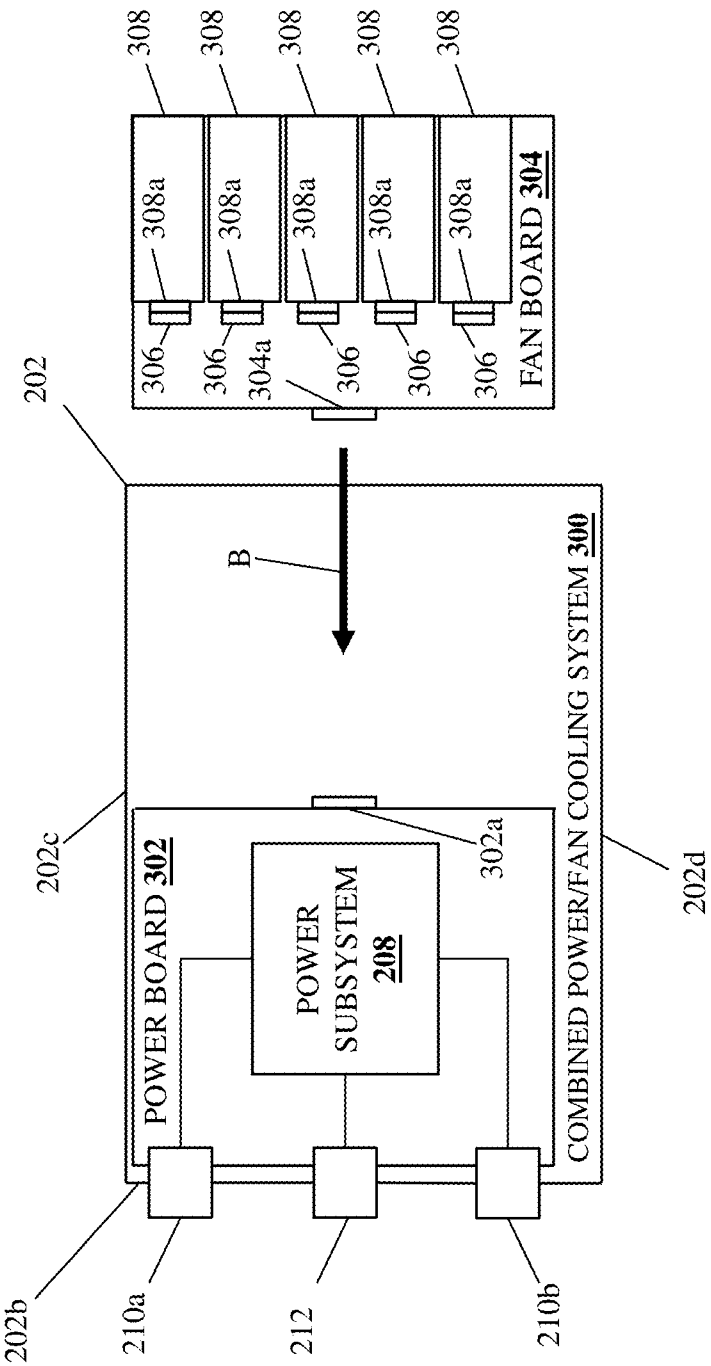
FIG. 3B is a schematic view illustrating an embodiment of fan devices being coupled to the combined power/fan cooling system of FIG. 3A.
Figure 3C:
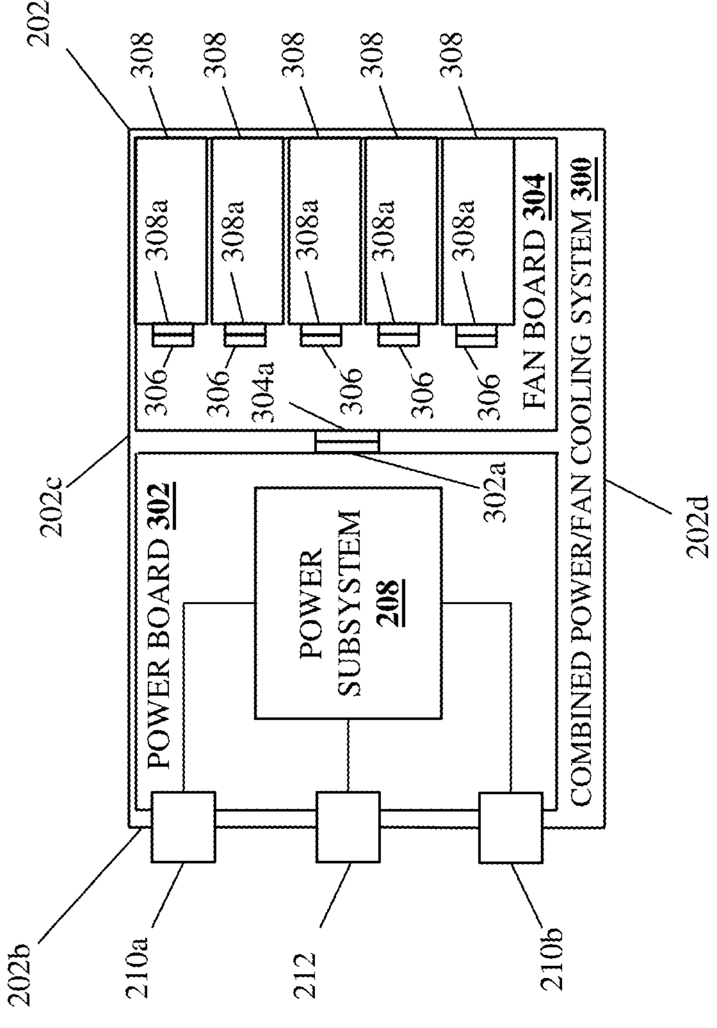
FIG. 3C is a schematic view illustrating an embodiment of fan devices coupled to the combined power/fan cooling system of FIG. 3A.

For example, referring now to FIGS. 3A, 3B, and 3C, an embodiment of a combined power/fan cooling system 300 is illustrated that is substantially similar to the combined power/fan cooling system 200 discussed above with reference to FIGS. 2A-2E, with similar elements provided with similar element numbers. However, as described below, the combined power/fan cooling system 300 replaces the power/fan board 206 discussed above with reference to FIGS. 2A-2E with separate connectable/dis-connectable boards for each of its power subsystem and fan subsystem. For example, as illustrated in FIG. 3A the combined power/fan cooling system 300 includes a power board 302 that is located in the power/fan chassis 202 (e.g., and mounted to its bottom wall), and the power subsystem 208 may be mounted to the power board 302, as well as coupled via the power board 302 to the power source connectors 210*a*/210*b* and component connector 212 similarly as described above for the power/fan board 206. Furthermore, the power board 302 may include a power board connector 302*a* that one of skill in the art in possession of the present disclosure will appreciate may be coupled to the power subsystem and the component connector 212 (e.g., via the power board 302), as well as to any other subsystems that one of skill in the art in possession of the present disclosure would recognize as providing the functionality described below.

As illustrated in FIG. 3B, the combined power/fan cooling system 300 may also include a fan board 304 having a fan board connector 304*a*. In the illustrated embodiment, a plurality of board connectors 306 may be mounted to the fan board 304, and while not illustrated, each of the board connectors 306 may be coupled (e.g., via the fan board 304) to the fan board connector 304*a* and/or any other subsystems in the combined power/fan cooling system 200 that one of skill in the art in possession of the present disclosure would recognize as enabling the functionality described below. In the specific examples illustrated and described below, five board connectors are provided in the combined power/fan cooling system 300, but one of skill in the art in possession of the present disclosure will appreciate how more (or fewer) board connectors may be utilized depending on the space available for the combined power/fan cooling system 300 in the computing device with which it is used.

While not illustrated or described in detail, a respective fan device 308 may be connected to each of the board connectors 306 similarly as illustrated and described above for the fan devices 216 and board connectors 214 with reference to FIG. 2B. However, while the fan devices 308 are illustrated and described as being easily connected to and disconnected from the fan board 304, one of skill in the art in possession of the present disclosure will appreciate how the fan devices 308 may not be easily connected to and disconnected from the fan board 304 (i.e., the fan devices 308 may be integrated with the fan board 304 and not easily removeable without the use of a tool and/or without causing damage to the fan devices 308 and/or fan board 304) while remaining within the scope of the present disclosure as well.

As will be appreciated by one of skill in the art in possession of the present disclosure, each of the fan devices 216 may include fans, motors, fan controller subsystems, and/or other fan components known in the art. Furthermore, as illustrated in FIGS. 3B and 3C, the fan board 304 may be connected to the power board 302 by positioning the fan board 304 adjacent the airflow channel defined by the bottom wall 202*a* and the side walls 202*c* and 202*d* such that the fan board connector 304*a* on the fan board 304 is aligned with the power board connector 302*a*, and then moving the fan board 304 in a direction B such that the fan board connector 304*a* engages the power board connector 302*a*. As such, while specific combined power/fan cooling systems 200 and 300 have been illustrated and described, a wide variety of modification to the combined power/fan cooling system of the present disclosure is envisioned as remaining within the scope of the present disclosure as well.

Figure 4A:
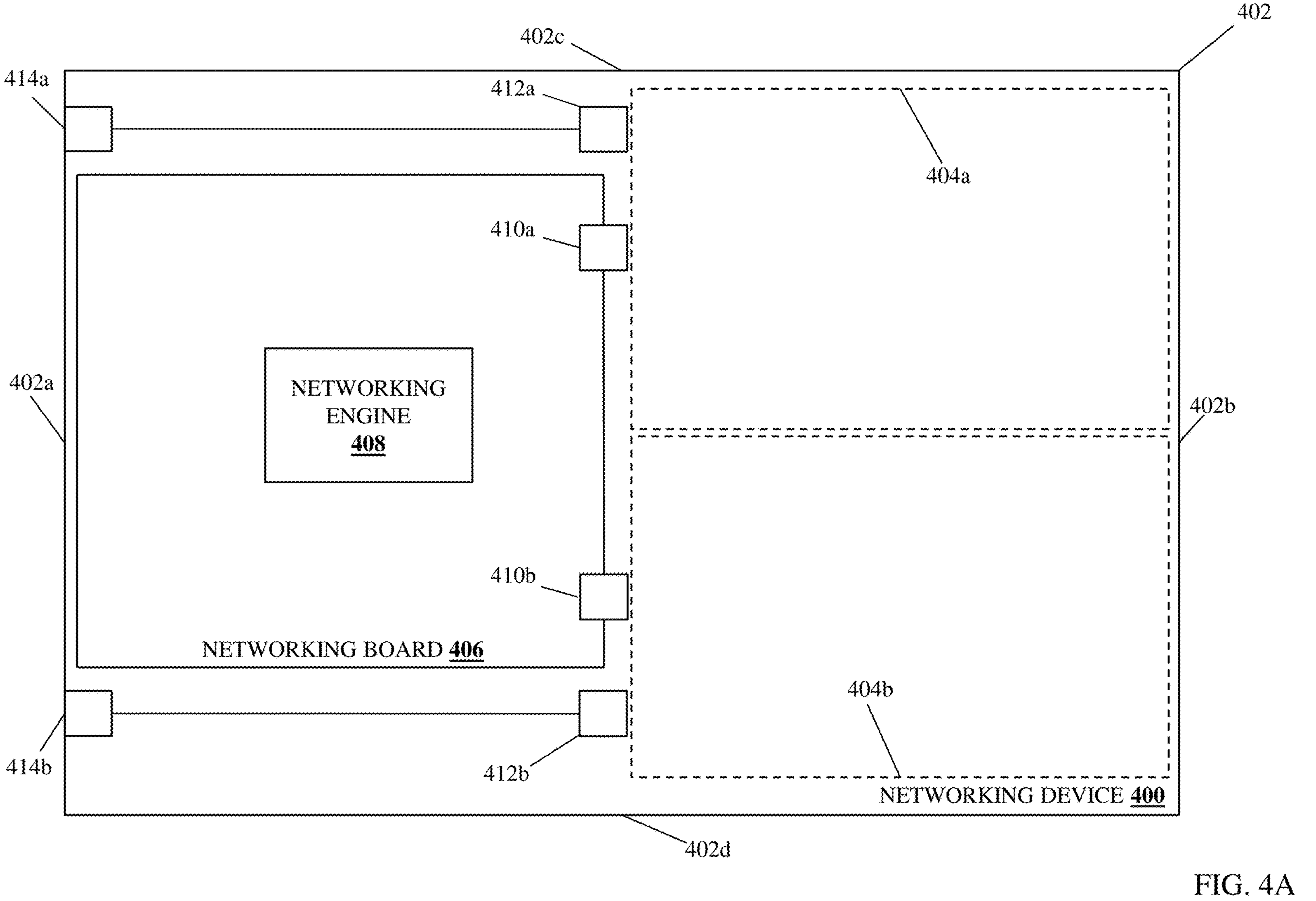
FIG. 4A is a schematic view illustrating an embodiment of a networking device that may be used with the combined power/fan cooling system of the present disclosure.

Referring now to FIG. 4A, an embodiment of a networking device 400 is illustrated that may be used with the combined power/fan cooling systems 200 and 300 discussed above with reference to FIGS. 2A-2E and 3A-3C, respectively. For example, the networking device 400 may be provided by the IHS 100 discussed above with reference to FIG. 1 and/or may include some or all of the components of the IHS 100, and in specific examples may be provided by a switch device. However, while illustrated and discussed as being provided by a switch device, one of skill in the art in possession of the present disclosure will recognize that the functionality of the networking device 400 discussed below may be provided by other computing devices that are configured to operate similarly as the networking device 400 discussed below.

In the illustrated embodiment, the networking device 400 includes a networking device chassis 402 that houses the components of the networking device 400, only some of which are illustrated and described below. In the illustrated embodiment, the networking device chassis 402 includes a front wall 402*a*, a rear wall 402*b* that is located opposite the networking device chassis 402 from the front wall 402*a*, and a pair of side wall 402*c* and 402*d* that are located opposite the networking device chassis 402 from each other and that each extend between the front wall 402*a* and the rear wall 402*b*. In the specific example illustrated and described below, the chassis 402 defines a pair of adjacent power/fan chassis slots 404*a* and 404*b* that are located adjacent the rear wall 402*b* and between the side walls 402*c* and 402*d*. While not illustrated or visible in FIG. 4A, one of skill in the art in possession of the present disclosure will appreciate how the rear wall 402*b* may define a power/fan chassis opening that is configured to allow the power/fan chassis on the combined power/fan cooling systems of the present disclosure to be moved into the power/fan chassis slots 404*a* and 404*b*.

In the illustrated embodiment, the chassis 402 houses a networking board 406 (e.g., a motherboard) that may support any of a variety of components of the networking device 400. For example, a processing system (not illustrated, but which may be similar to the processor 102 discussed above with reference to FIG. 1 and may be provided by a Network Processing Unit (NPU) in the specific examples provided herein) and a memory system (not illustrated, but which may be similar to the memory 114 discussed above with reference to FIG. 1) that is coupled to the processing system and that includes instructions that, when executed by the processing system, cause the processing system to provide a networking engine 408 that is configured to perform the functionality of the networking engines and/or networking devices discussed below. Furthermore, while not illustrated in FIG. 4A, a communication system may be mounted to the networking board 406 and coupled to the networking engine 408 (e.g., via traces in the networking board 406 and/or other couplings between the communication system and the processing system), and may include a plurality of networking ports that are accessible on the front wall 402*a* of the chassis 402. However, while a few specific components have been described, one of skill in the art in possession of the present disclosure will appreciate how any of a variety of components will fall within the scope of the present disclosure.

As illustrated, a pair of component connectors 410*a* and 410*b* (e.g., DC power connectors) may be provided on the networking board 406 in a spaced-apart orientation adjacent the power/fan chassis slots 404*a* and 404*b*, respectively, which as described in further detail below allows a corresponding pair of the combined power/fan cooling systems of the present disclosure to be connected to the networking board 406. Furthermore, a pair of internal power source connectors 412*a* and 412*b* (e.g., AC power connectors) may be provided on opposite sides of the networking board 406 and between the networking board 406 and the side walls 202*c* and 202*d*, respectively, and adjacent the power/fan chassis slots 404*a* and 404*b*, respectively, which as described in further detail below allows a corresponding pair of the combined power/fan cooling systems of the present disclosure to be connected to a power source.

In the specific example illustrated in FIG. 4A, the internal power source connectors 412*a* and 412*b* are coupled (e.g., via cables or other couplings known in the art) to front surface external power source connectors 414*a* and 414*b*, respectively, that one of skill in the art in possession of the present disclosure will appreciate may be further coupled (e.g., via AC cables/plugs) to power source(s) such as, for example, a power outlet and/or other power source coupling that would be apparent to one of skill in the art in possession of the present disclosure. For example, as optical communication systems provided on networking devices are integrated into NPU Application-Specific Integrated Circuits (ASICs) (also referred to as "onboard optics" when optical connectivity is integrated into NPU ASICs) and allow communication system connectivity on the front wall 402*a* of the chassis 402 to be provided by relatively smaller Multi-fiber Push-On (MPO) connectors, space will become available on the front wall 402*a* of the chassis 402 to allow power source connectors like the front surface external power source connectors 414*a* and 414*b* illustrated in FIG. 4A. As such, embodiments of the present disclosure may provide power source connectivity on the front wall 402*a* of the chassis 402 of the networking device 400 that also provides communication system connectivity, which one of skill in the art in possession of the present disclosure will appreciate configures the networking device 400 similarly as server devices and/other computing devices that it may be used with (i.e., with their power source connectivity on their front wall that is co-located with the front wall 402*a* of the chassis 402 of the networking device 400).

Figure 4B:
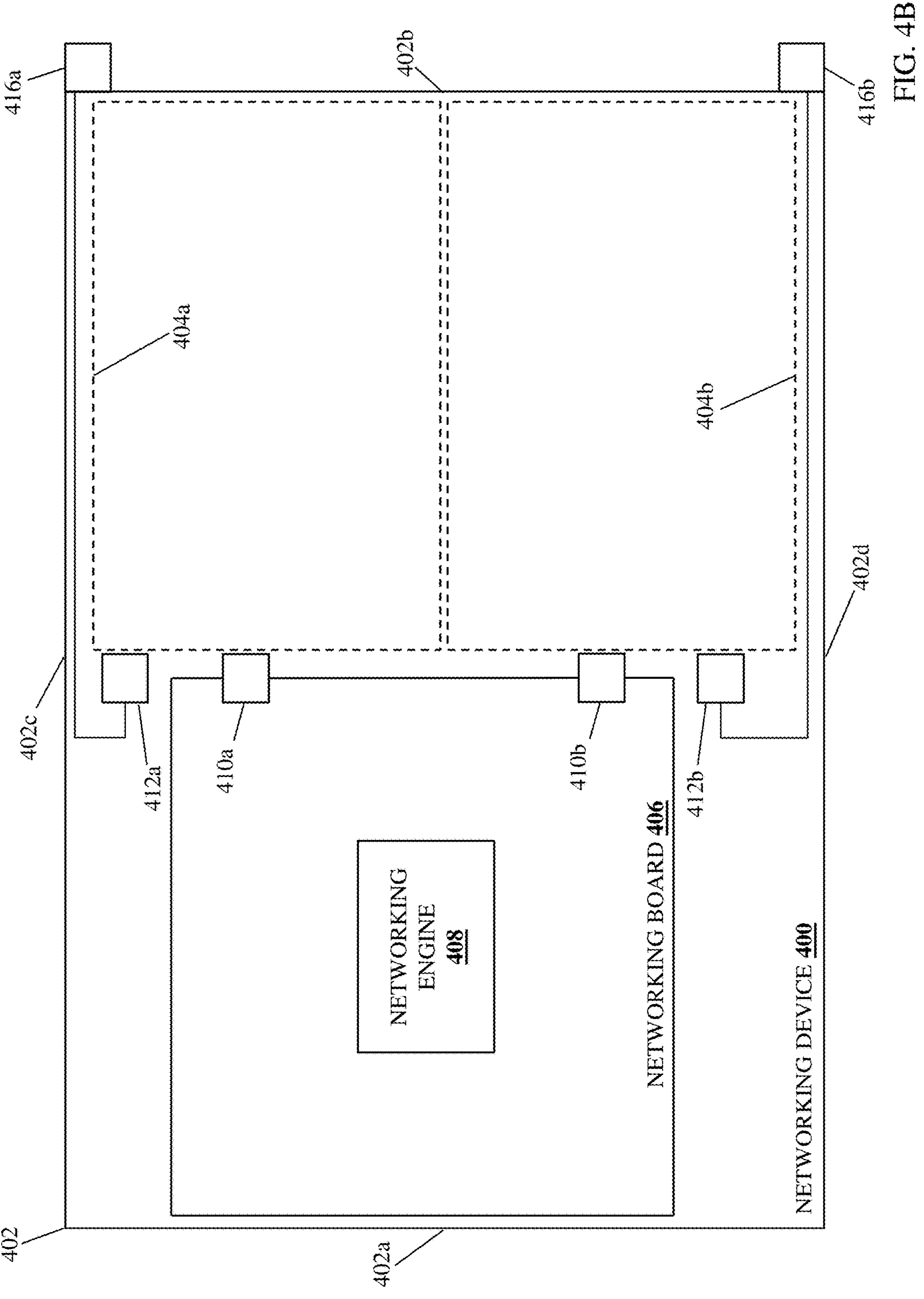
FIG. 4B is a schematic view illustrating an embodiment of a networking device that may be used with the combined power/fan cooling system of the present disclosure.

However, in situations in which space available on the front wall 402*a* is limited, the front surface external power source connectors 414*a* and 414*b* may be replaced with rear surface external power source connectors 416*a* and 416*b*, as illustrated in FIG. 4B, that are coupled to the internal power source connectors 412*a* and 412*b*, respectively, and that may be further coupled (e.g., via AC cables/plugs) to power source(s) such as, for example, a power outlet and/or other power source coupling that would be apparent to one of skill in the art in possession of the present disclosure. As will be appreciated by one of skill in the art in possession of the present disclosure, the power source connectors 416*a* and 416*b* may be provided such that they are accessible adjacent the rear wall 402*b* of the networking device chassis 402 in a variety of manners that also ensure that the combined power/fan cooling systems of the present disclosure may be provided in, and removed from, the networking device 400 as described below. As such, while a specific networking device 400 has been illustrated and described, one of skill in the art in possession of the present disclosure will recognize that networking devices (or other computing devices operating according to the teachings of the present disclosure in a manner similar to that described below for the networking device 400) may include a variety of components and/or component configurations for providing conventional networking device functionality, as well as the combined power/fan cooling functionality discussed below, while remaining within the scope of the present disclosure as well.

Figure 5:
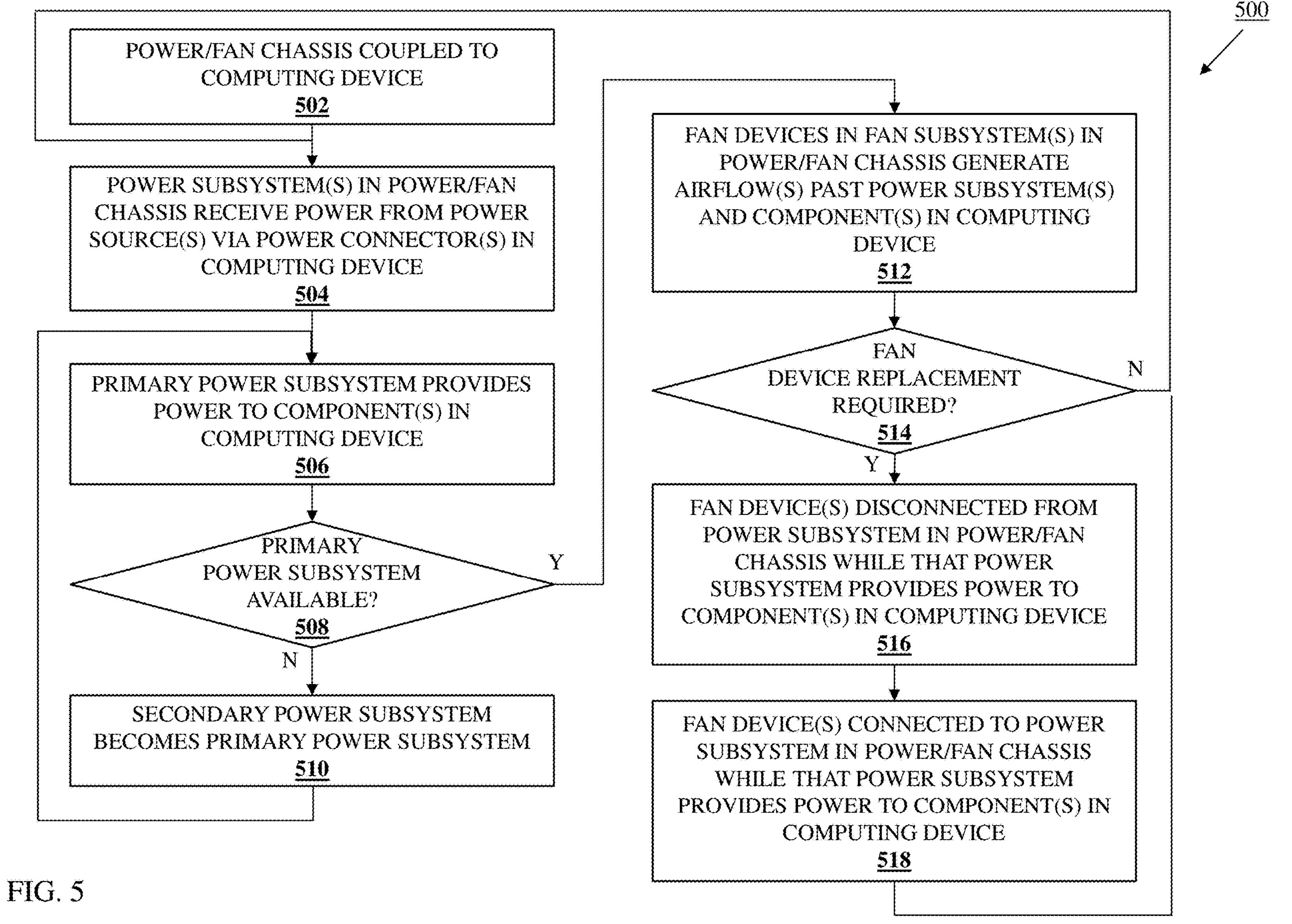
FIG. 5 is a flow chart illustrating an embodiment of a method for powering and cooling a computing device.

Referring now to FIG. 5, an embodiment of a method 500 for powering and cooling a computing device is illustrated. As discussed below, the systems and methods of the present disclosure provide a combined power/fan cooling system that includes a power subsystem that provides power for a computing device, as well as a fan subsystem with a plurality of "hot-swappable" fan devices that provide cooling for the power subsystem and the computing device. For example, the combined power/fan cooling system of the present disclosure may include a power/fan chassis that may be provided in a computing device. A power subsystem housed in the power/fan chassis receives power from a power source when the power/fan chassis is provided in the computing device, and provides the power to component(s)

in the computing device. A fan subsystem located in the power/fan chassis adjacent the power subsystem includes fan devices that generate an airflow past the power subsystem and the component(s) in the computing device when the power/fan chassis is provided in the computing device. Each of the fan devices is also configured to be connected to, and disconnected from, the power subsystem while the power subsystem is providing the power to the component(s) in the computing device. As discussed below, the combined power/fan cooling systems of the present disclosure allows the provisioning of more fan devices in a computing device relative to conventional cooling systems, while also allowing fan devices that are used to cool the power subsystem to be "hot-swapped" and/or replaced in the event that they cease operating.

Figure 6:
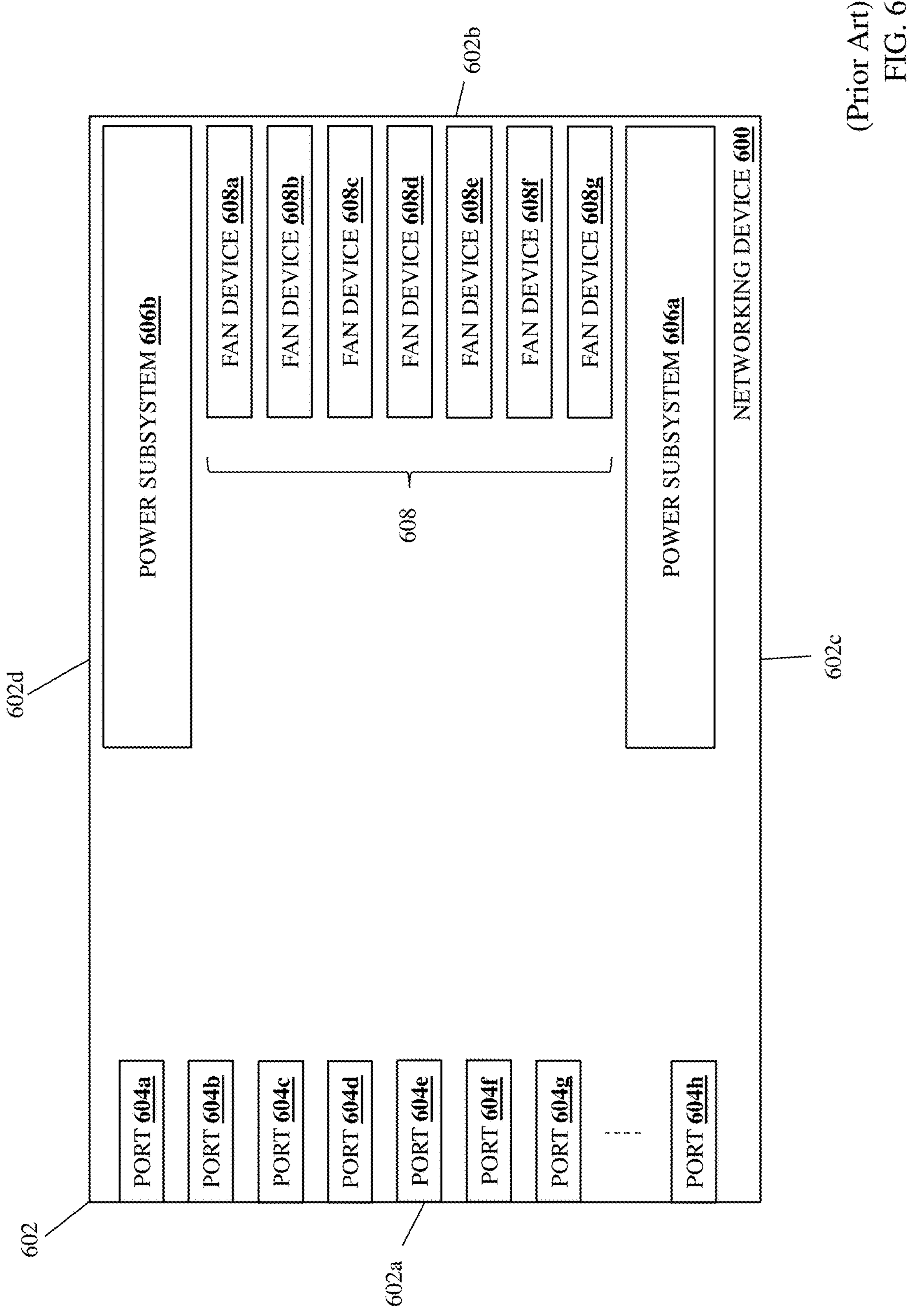
FIG. 6 is a perspective view illustrating an embodiment of a conventional networking device including a conventional power system and a conventional cooling system.

With reference to FIG. 6, an embodiment of a conventional networking device 600 including conventional power subsystems and a conventional fan subsystem is illustrated and briefly discussed for purposes of comparison to the combined power/fan cooling system of the present disclosure. In the illustrated example, the conventional networking device 600 includes a networking device chassis 602 having a front wall 602*a*, a rear wall 602*b* that is located opposite the chassis 602 from the front wall 602*a*, a pair of opposing side walls 602*c* and 602*d* that are located opposite the networking device chassis 602 from each other and that extend from the front wall 602*a* to the rear wall 602*b*, and one of skill in the art in possession of the present disclosure will appreciate how the chassis may also include a top wall and a bottom wall (not numbered in FIG. 6) that are located opposite the chassis 602 from each other and that each extend between the front wall 602*a*, the rear wall 602*b*, and the sides walls 602*c* and 602*d*. A plurality of ports 604*a*, 604*b*, 604*c*, 604*d*, 604*e*, 604*f*, 604*g*, and up to 604*h* (e.g., Quad Small Form-factor Pluggable (QSFP) ports) are accessible on the front wall 602*a* of the networking device chassis 602, and the rear wall 602*b* defines an airflow channel that is located opposite the networking device chassis 602 from the front wall 602*b*/ports 604*a*-604*h*.

As can be seen in FIG. 6, a pair of conventional power subsystems 606*a* and 606*b* are provided on opposite sides of the networking device chassis 602, with the conventional power subsystem 606*a* located immediately adjacent the side wall 602*c* and the conventional power subsystem 606*b* located immediately adjacent the side wall 602*d*. Furthermore, a conventional fan subsystem 608 is provided between the conventional power subsystems 606*a* and 606*b* and immediately adjacent the airflow channel defined by the rear wall 602*b*, and in the illustrated example the conventional fan subsystem 608 includes seven fan devices 608*a*, 608*b*, 608*c*, 608*d*, 608*e*, 608*f*, and 608*g* that are configured to generate an airflow through the networking device chassis 602 and out of the front wall 602*a*.

As discussed below, the networking device chassis 402 of the networking device 400 discussed above with reference to FIGS. 4A and 4B may be provided with the same dimensions as the networking device chassis 602 of the conventional networking device 600, with the combined power/fan cooling system of the present disclosure enabling increased cooling via the provisioning of addition fan devices relative to the conventional fan subsystem 608 of the conventional networking device 600. However, while benefits over a specific conventional networking device are illustrated and described herein, one of skill in the art in possession of the present disclosure will appreciate how similar benefits may be realized over conventional networking devices having different dimensions than the conventional networking device 600 while remaining within the scope of the present disclosure as well.

Figure 7A:
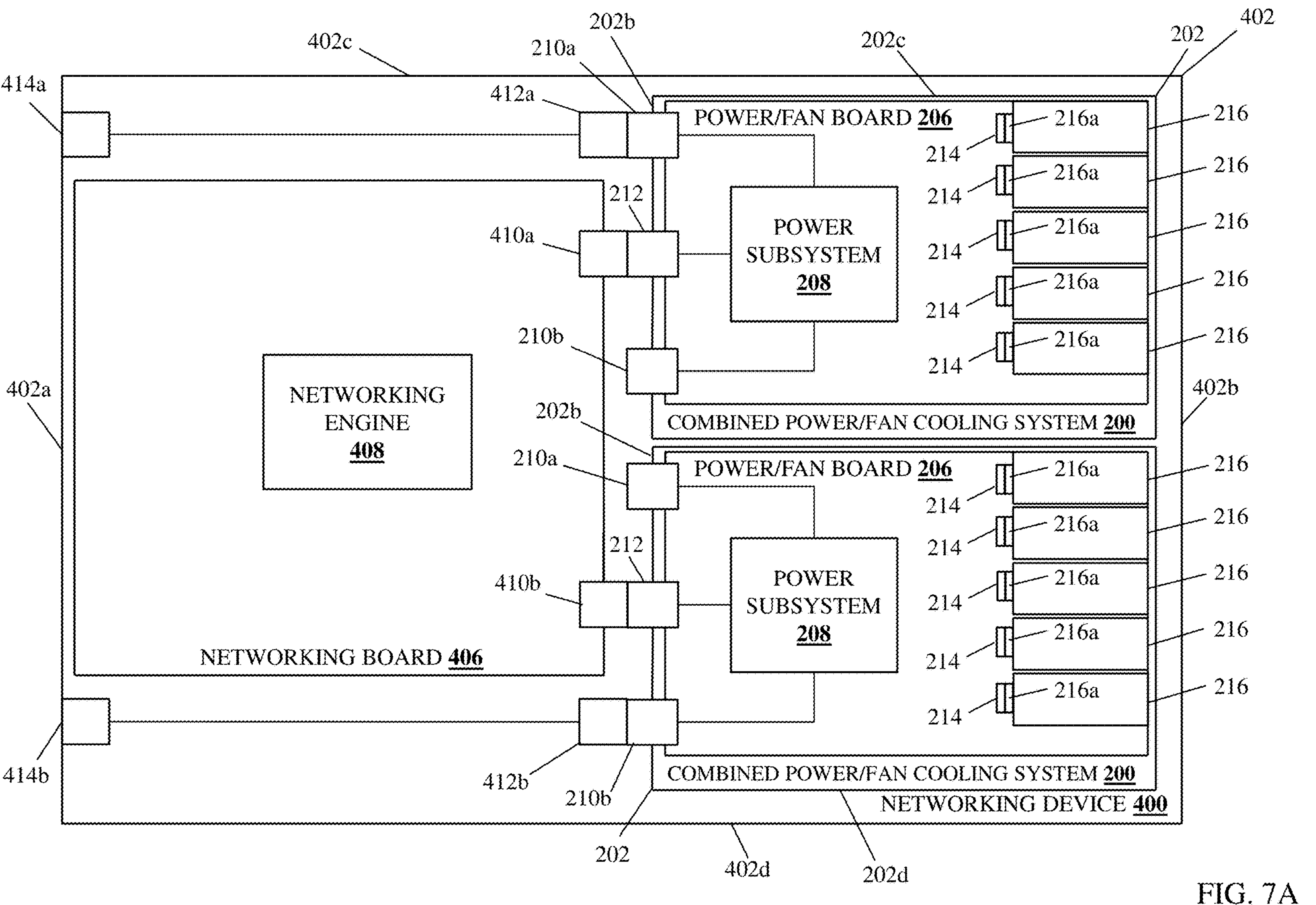
FIG. 7A is a schematic view illustrating an embodiment of the combined power/fan cooling system of FIG. 2C coupled to the networking device of FIG. 4.
Figure 7B:
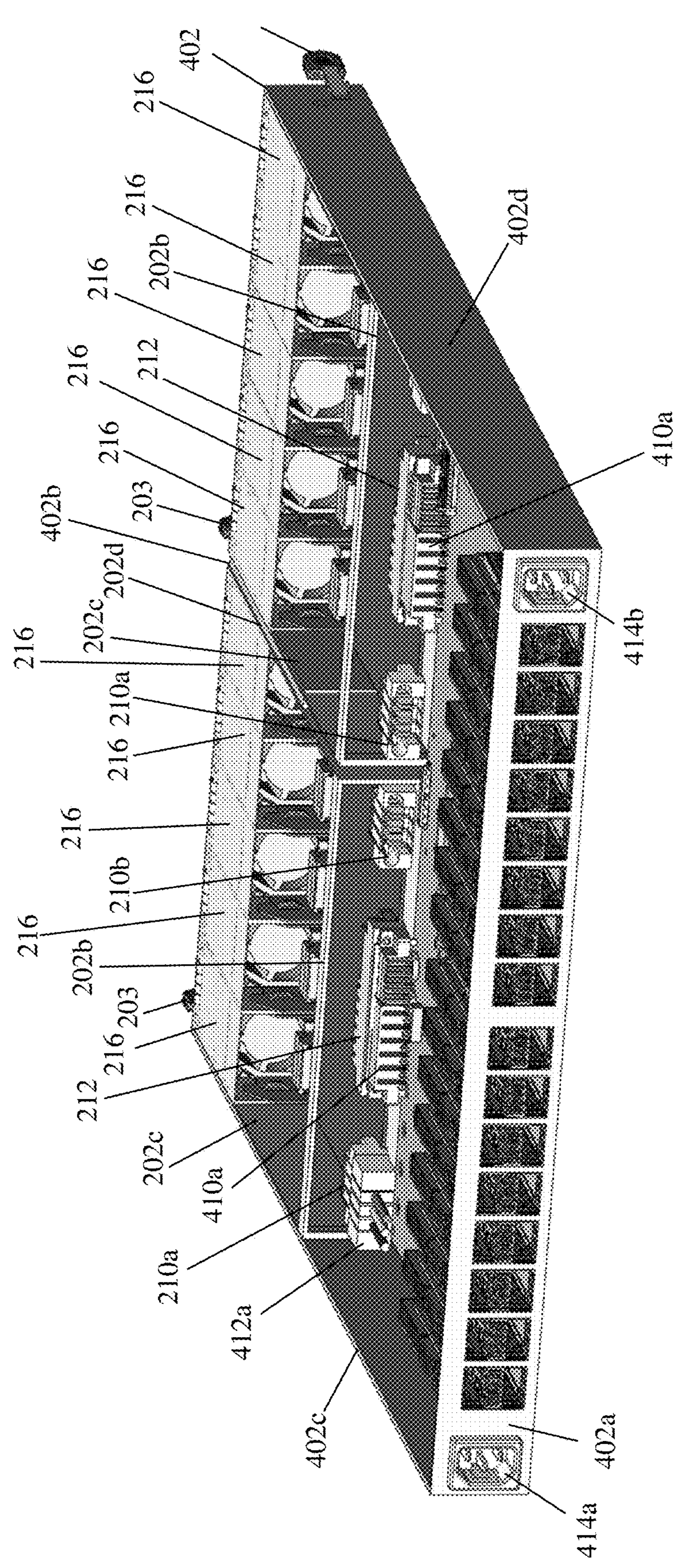
FIG. 7B is a front perspective view illustrating an embodiment of the combined power/fan cooling system of FIGS. 2D and 2E coupled to the networking device of FIG. 4.
Figure 7C:
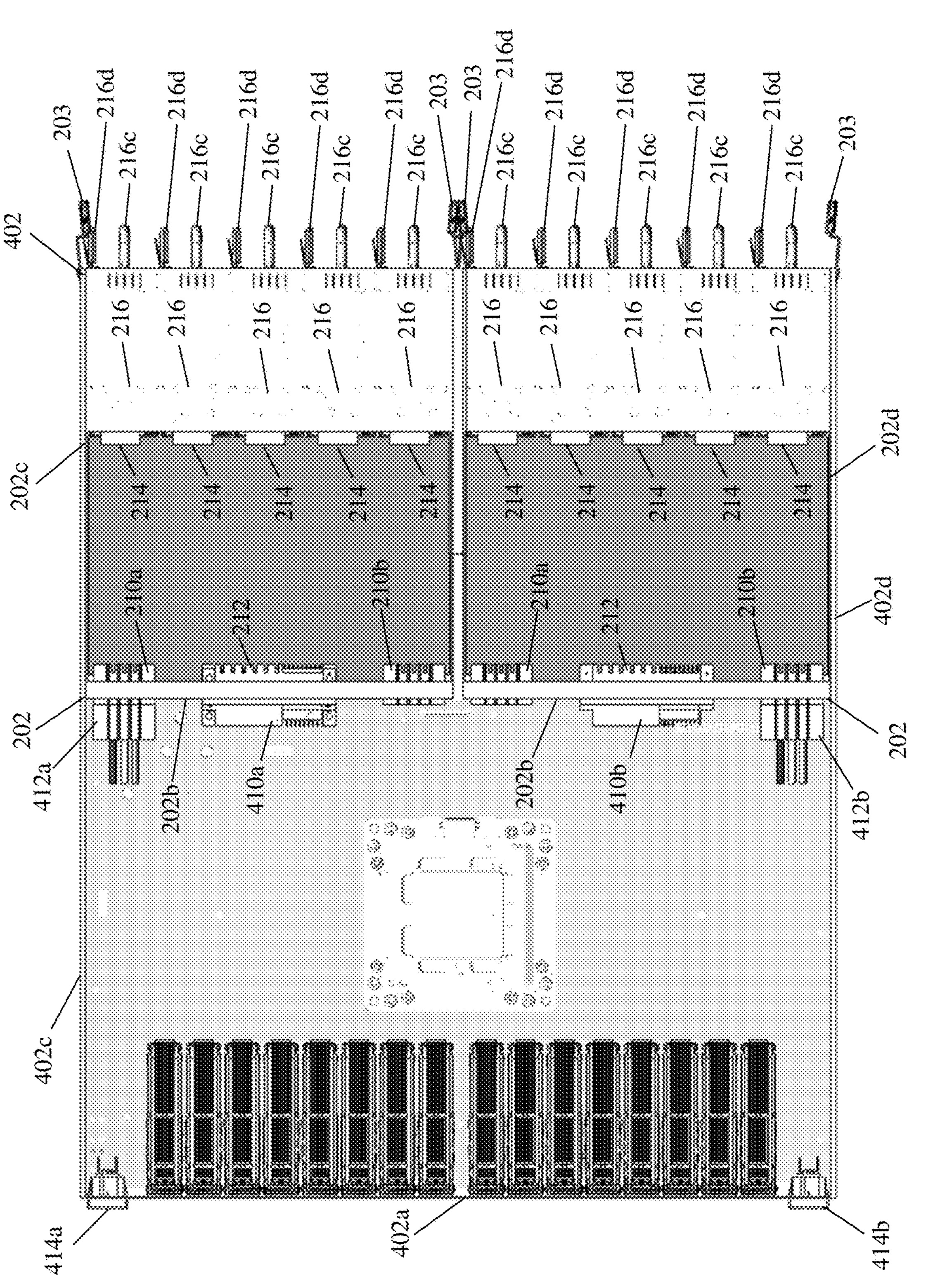
FIG. 7C is a top view illustrating an embodiment of the combined power/fan cooling system of FIGS. 2D and 2E coupled to the networking device of FIG. 4.

The method 500 begins at block 502 where power/fan chassis are coupled to a computing device. As will be appreciated by one of skill in the art in possession of the present disclosure, in an embodiment of block 502 and/or prior to the method 500, fan devices may be provided in the combined power/fan cooling system of the present disclosure (e.g., by providing the fan devices 216 in the combined power/fan cooling system 200 as described above with reference to FIGS. 2B and 2C, by providing the fan devices 308 on the fan board 304 and then providing the fan board 304 in the combined power/fan cooling system 300 as described above with reference to FIGS. 3B and 3C, etc.). With reference to FIGS. 7A, 7B, and 7C, a respective one of the combined power/fan cooling systems 200 may be provided in each of the power/fan chassis slots 404*a* and 404*b* included on the networking device chassis 402 of the networking device 400 by positioning that combined power/fan cooling system 200 adjacent that power/fan chassis slot 404*a* or 404*b* such that the power source connector 210*a* and the component connector 212 on one of those combined power/fan cooling systems 200 are aligned with the internal power source connector 412*a* and the component connector 410*a* adjacent the power/fan chassis slot 404*a*, or such that the power source connector 210*b* and the component connector 212 on the other of those combined power/fan cooling systems 200 are aligned with the internal power source connector 412*b* and the component connector 410*b* adjacent the power/fan chassis slot 404*b*.

The combined power/fan cooling systems 200 may then be moved into each of the power/fan chassis slots 404*a* and 404*b* included on the networking device chassis 402 of the networking device 400 such that the power source connector 210*a* and the component connector 212 on one of those combined power/fan cooling systems 200 engage the internal power source connector 412*a* and the component connector 410*a*, respectively, adjacent the power/fan chassis slot 404*a*, and such that the power source connector 210*b* and the component connector 212 on the other of those combined power/fan cooling systems 200 engage the internal power source connector 412*b* and the component connector 410*b*, respectively, adjacent the power/fan chassis slot 404*b*.

Figure 8:
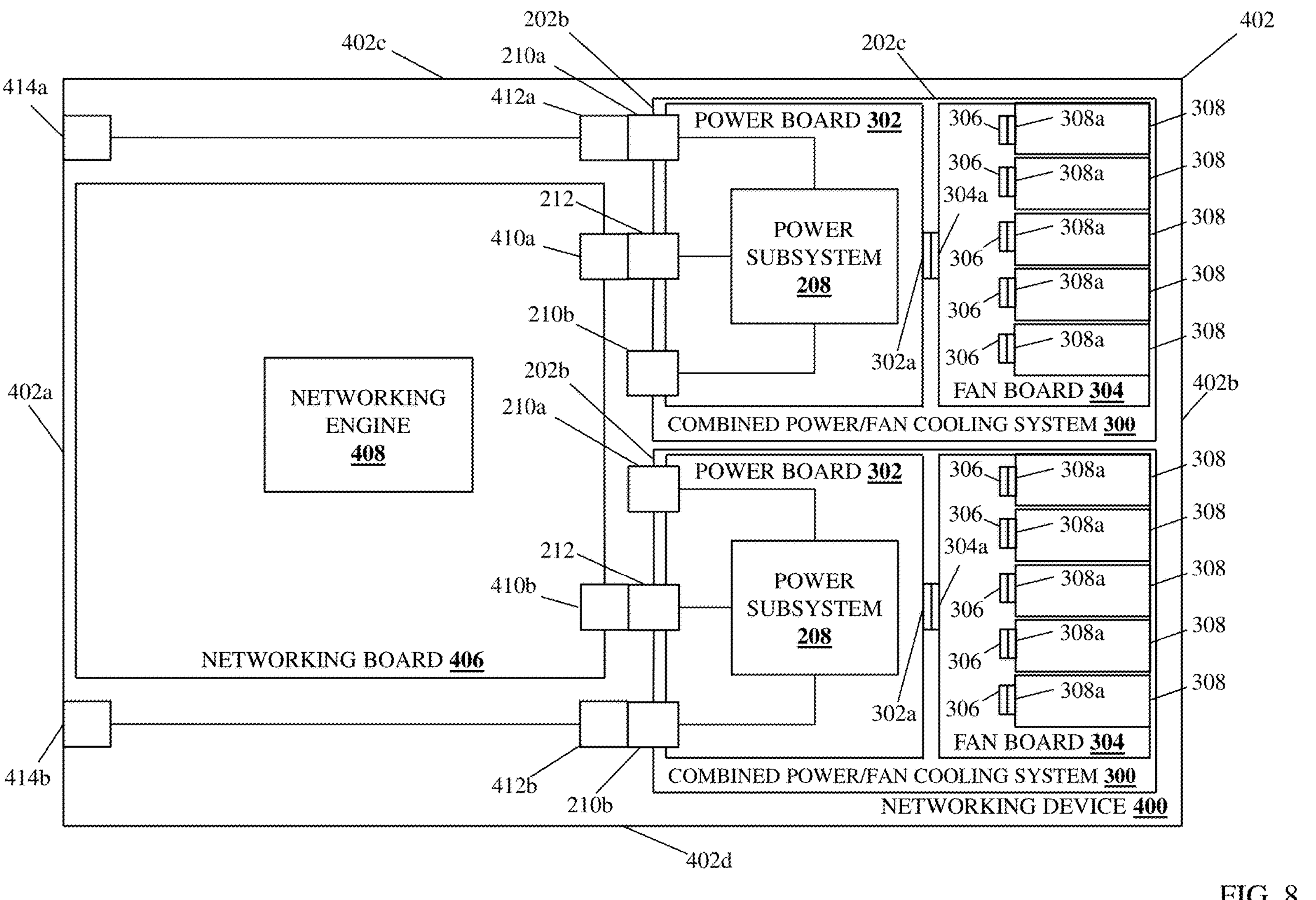
FIG. 8 is a schematic view illustrating an embodiment of the combined power/fan cooling system of FIG. 3C coupled to the networking device of FIG. 4.

With reference to FIG. 8, in another embodiment, a respective one of the combined power/fan cooling systems 300 may be provided in each of the power/fan chassis slots 404*a* and 404*b* included on the networking device chassis 402 of the networking device 400 by positioning that combined power/fan cooling system 300 adjacent that power/fan chassis slot 404*a* or 404*b* such that the power source connector 210*a* and the component connector 212 on one of those combined power/fan cooling systems 300 are aligned with the internal power source connector 412*a* and the component connector 410*a* adjacent the power/fan chassis slot 404*a*, or such that the power source connector 210*b* and the component connector 212 on the other of those combined power/fan cooling systems 200 are aligned with the internal power source connector 412*b* and the component connector 410*b* adjacent the power/fan chassis slot 404*b*. The combined power/fan cooling systems 300 may then be moved into each of the power/fan chassis slots 404*a* and 404*b* included on the networking device chassis 402 of the networking device 400 such that the power source connector 210*a* and the component connector 212 on one of those combined power/fan cooling systems 200 engage the internal power source connector 412*a* and the component connector 410*a*, respectively, adjacent the power/fan chassis slot 404*a*, and such that the power source connector 210*b* and the component connector 212 on the other of those combined power/fan cooling systems 200 engage the internal power source connector 412*b* and the component connector 410*b*, respectively, adjacent the power/fan chassis slot 404*b*.

As will be appreciated by one of skill in the art in possession of the present disclosure, the provisioning of the combined power/fan cooling systems 200 and 300 in the networking device 400 reconfigures the power subsystem of the networking device 400 relative to the conventional networking device 600 discussed above with reference to FIG. 6. For example, the power subsystems 606*a* and 606*b* in the conventional networking device 600 typically include several circuit boards that are "sandwiched" together, and one of skill in the art in possession of the present disclosure will appreciate how the power subsystem 208 on the power/fan board 206 or the power board 302 may provide at least some of those circuit boards "side-by-side", thus reducing the height of the power subsystem 208 that would otherwise operate to block airflow from the fan devices 216 and 308.

Furthermore, in some embodiments the power subsystems 606*a* and 606*b* in the conventional networking device 600 may each include a respective integrated fan device (i.e., a fan device that is not easily removeable from the chassis of that power subsystem without the use of tools and/or without causing damage to the fan device and/or the chassis by both opening up that chassis and disconnecting (e.g., unscrewing) that fan device), and that integrated fan device may be eliminated from the power subsystem 208 and provided in the fan subsystems of the combined power/fan cooling systems 200 or 300. As will be appreciated by one of skill in the art in possession of the present disclosure, the removal of the integrated fan device from the power subsystem of networking devices eliminates the power subsystem component that is most likely to fail, thus increasing the Mean Time Before Failure (MTBF) of those power subsystems.

Furthermore, the provisioning of the combined power/fan cooling systems 200 and 300 in the networking device 400 as illustrated in FIGS. 7A-7C and 8 may increase the number of fan devices that may be provided in a networking device chassis from seven (as illustrated in the conventional networking device 600 discussed above with reference to FIG. 6) to ten, and in the situation in which the power subsystems 606*a* and 606*b* each include a respective integrated fan, may increase the number of fan devices that may be provided in a networking device from nine to ten. As such, the provisioning of the combined power/fan cooling systems 200 and 300 in the networking device 400 will increase the amount of airflow that may be generated through the chassis 402 of the networking device 400 (i.e., relative to the conventional networking device 600) during its operation.

Figure 9:
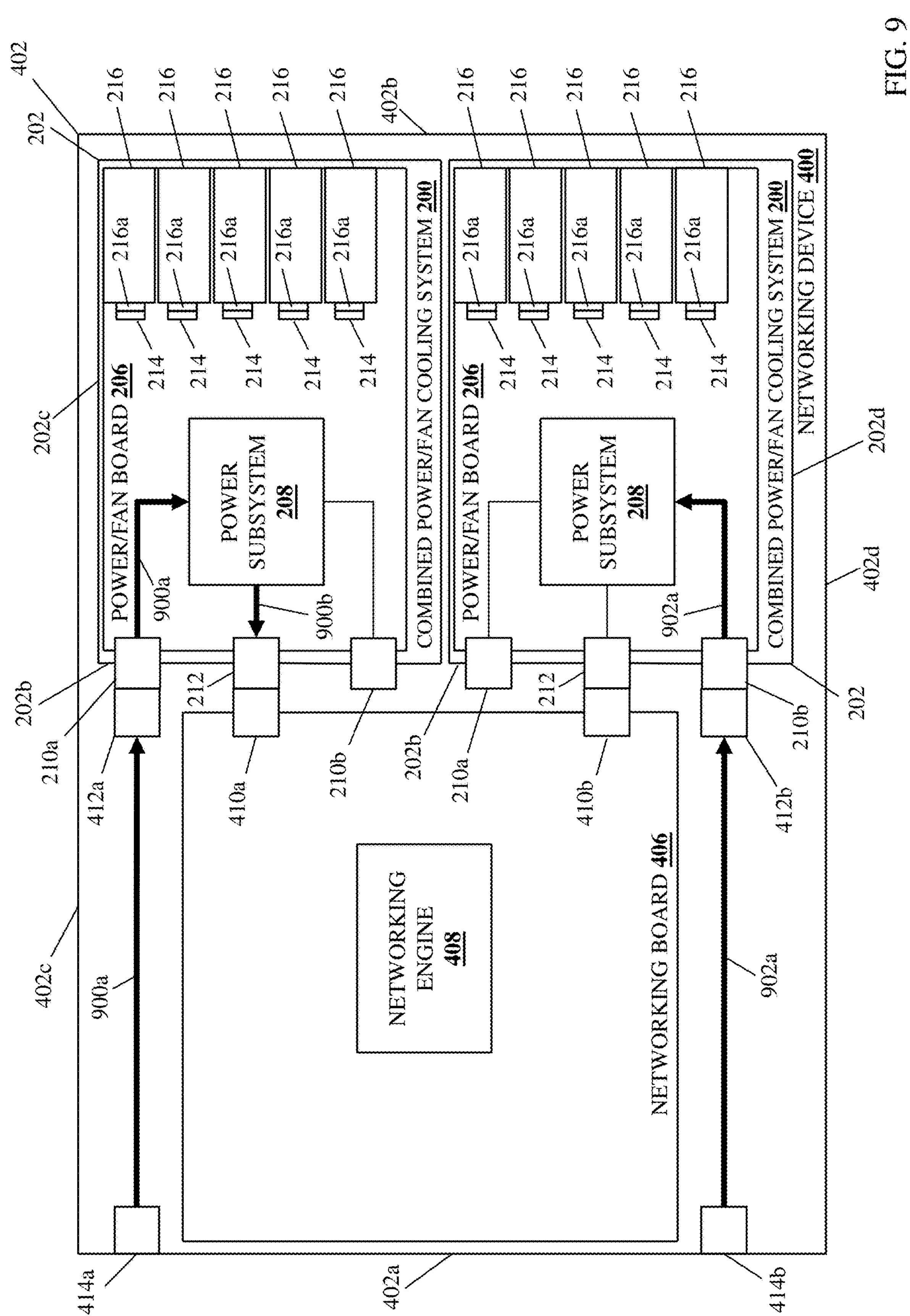
FIG. 9 is a schematic view illustrating an embodiment of the networking device and combined power/fan cooling systems of FIGS. 7A-7B operating during the method of FIG. 5.

The method 500 then proceeds to block 504 where one or more power subsystems in the power/fan chassis receive power from respective power sources via respective power connectors in the computing device. With reference to FIG. 9, in an embodiment of block 504, the power subsystem 208 in the combined power/fan cooling system 200 that is located in the power/fan chassis slot 404*a* may perform power receiving operations 900*a* that include receiving power from a power source via the external power source connector 414*a* (e.g., the wall outlet that may be coupled to the external power source connector 414*a*), the internal power source connector 412*a*, and the power source connector 210*a*. As also illustrated in FIG. 9, the power subsystem 208 in the combined power/fan cooling system 200 that is located in the power/fan chassis slot 404*b* may perform power receiving operations 902*a* that include receiving power from a power source via the external power source connector 414*b* (e.g., the wall outlet that may be coupled to the external power source connector 414*b*), the internal power source connector 412*b*, and the power source connector 210*b*.

In some embodiments, the fan devices 216 in both of the combined power/fan cooling system 200 in the networking device 400 may be powered using power received by the power subsystems 208 in both of the combined power/fan cooling system 200 in the networking device 400 as part of the power receiving operations 900*a* and 902*a*. As discussed below, such fan device power techniques allow the fan devices in both of the combined power/fan cooling system 200 in the networking device 400 to continue operating in the event one of those power subsystems 208 becomes unavailable.

Figure 10:
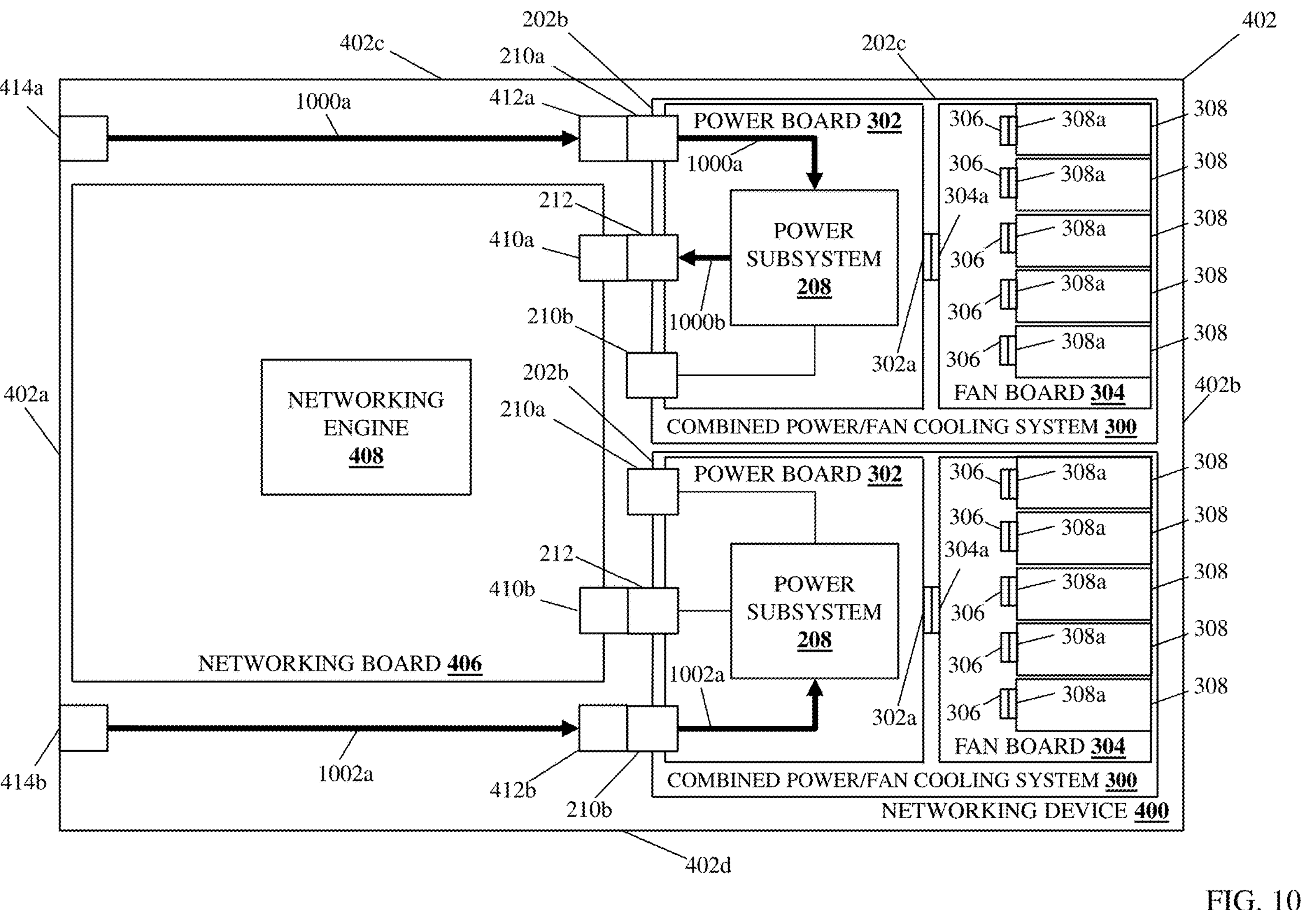
FIG. 10 is a schematic view illustrating an embodiment of the networking device and combined power/fan cooling systems of FIG. 8 operating during the method of FIG. 5.

With reference to FIG. 10, in an embodiment of block 504, the power subsystem 208 in the combined power/fan cooling system 300 that is located in the power/fan chassis slot 404*a* may perform power receiving operations 1000*a* that include receiving power from a power source via the external power source connector 414*a* (e.g., the wall outlet that may be coupled to the external power source connector 414*a*), the internal power source connector 412*a*, and the power source connector 210*a*. As also illustrated in FIG. 10, the power subsystem 208 in the combined power/fan cooling system 300 that is located in the power/fan chassis slot 404*b* may perform power receiving operations 1002*a* that include receiving power from a power source via the external power source connector 414*b* (e.g., the wall outlet that may be coupled to the external power source connector 414*b*), the internal power source connector 412*b*, and the power source connector 210*b*.

The method 500 then proceeds to block 506 where a primary power subsystem provides power to one or more components in the computing device. With reference back to FIG. 9, in an embodiment of block 506, the power subsystem 208 in the combined power/fan cooling system 200 that is located in the power/fan chassis slot 404*a* may perform power provisioning operations 900*b* that include providing the power received at block 504 via the component connector 212 and the component connector 410*a* to the networking board 406, which one of skill in the art in possession of the present disclosure will appreciate may cause that power to be provided to any networking components included on and/or coupled to the networking board 406 (e.g., the processing system and the memory system that provide the networking engine 408, networking ports mounted to the networking board 406 and accessible on the front wall 402*a* of the networking device chassis 402, as well as any other networking components that would be apparent to one of skill in the art in possession of the present disclosure.)

Furthermore, one of skill in the art in possession of the present disclosure will appreciate how the power provisioning operations 900*b* performed by the power subsystem 208 in the combined power/fan cooling system 200 that is located in the power/fan chassis slot 404*a* may include providing power to each of its fan devices 216 via the power/fan board 206, the board connectors 214, and the fan connectors 216*a*. Similarly, at block 506, the power subsystem 208 in the combined power/fan cooling system 200 that is located in the power/fan chassis slot 404*b* may perform power provisioning operations that include providing power to each of its fan devices 216 via the power/fan board 206, the board connectors 214, and the fan connectors 216*a*. As discussed below, the combined power/fan cooling system 200 that is located in the power/fan chassis slot 404*b* may operate as a secondary power subsystem that is configured to provide power to the networking board 406 in the event a primary power subsystem provided by the combined power/fan cooling system 200 that is located in the power/fan chassis slot 404*a* is unable to provide power to the networking board 406, and thus may only use power received from the power source to power its fan devices 216 at block 506.

With reference back to FIG. 10, in an embodiment of block 506, the power subsystem 208 in the combined power/fan cooling system 300 that is located in the power/fan chassis slot 404*a* may perform power provisioning operations 1000*b* that include providing the power received at block 504 via the component connector 212 and the component connector 210*a* to the networking board 406, which one of skill in the art in possession of the present disclosure will appreciate may cause that power to be provided to any networking components included on and/or coupled to the networking board 406 (e.g., the processing system and the memory system that provide the networking engine 408, networking ports mounted to the networking board 406 and accessible on the front wall 402*a* of the networking device chassis 402, as well as any other networking components that would be apparent to one of skill in the art in possession of the present disclosure.)

Furthermore, one of skill in the art in possession of the present disclosure will appreciate how the power provisioning operations 1000*b* performed by the power subsystem 208 in the combined power/fan cooling system 300 that is located in the power/fan chassis slot 404*a* may include providing power to each of its fan devices 308 via the power board 302, the power board connector 302*a*, the fan board connector 304*a*, the fan board 304, the board connectors 306, and the fan connectors 308*a*. Similarly, at block 506, the power subsystem 208 in the combined power/fan cooling system 300 that is located in the power/fan chassis slot 404*b* may perform power provisioning operations that include providing power to each of its fan devices 308 via the power board 302, the power board connector 302*a*, the fan board connector 304*a*, the fan board 304, the board connectors 306, and the fan connectors 308*a*. As discussed below, the combined power/fan cooling system 300 that is located in the power/fan chassis slot 404*b* may operate as a secondary power subsystem that is configured to provide power to the networking board 406 in the event a primary power subsystem provided by the combined power/fan cooling system 200 that is located in the power/fan chassis slot 404*a* is unable to provide power to the networking board 406, and thus may only use power received from the power source to power its fan devices 308 at block 506.

The method 500 then proceeds to decision block 508 where the method 500 proceeds depending whether the primary power subsystem is available. As discussed above, the power subsystem 208 in one of the combined power/fan cooling systems 200/300 provided in one of the power/fan chassis slots 404*a* and 404*b* may operate as a primary power subsystem that provides power to the networking board 406 while the power subsystem 208 in the other of the combined power/fan cooling systems 200/300 provided in the other of the power/fan chassis slots 404*a* and 404*b* may operate as a secondary power subsystem that is configured to provide power to the networking board 406 in the event the primary power subsystem is unable to do so. As such, the method 500 may operate at decision block 508 depending on whether the primary power subsystem is available or otherwise able to provide power to the networking board 406.

Figure 11:
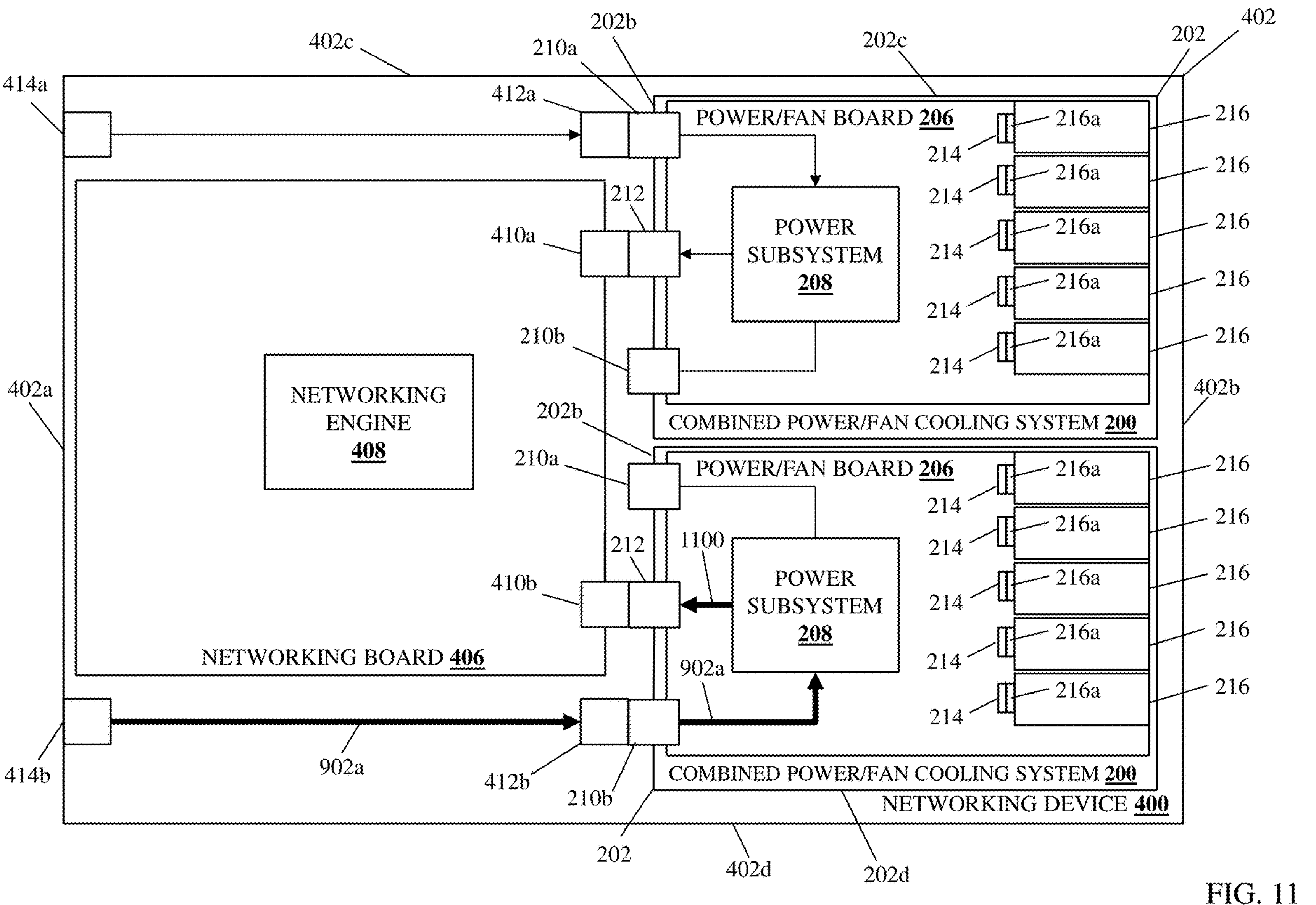
FIG. 11 is a schematic view illustrating an embodiment of the networking device and combined power/fan cooling systems of FIGS. 7A-7B operating during the method of FIG. 5.

If, at decision block 506, the primary power subsystem is not available, the method 500 proceeds to block 510 where a secondary power subsystem becomes the primary power subsystem. With reference to FIG. 11, in an embodiment of block 510, the power subsystem 208 in the combined power/fan cooling system 200 that is located in the power/fan chassis slot 404*a* may be unable to provide power to the networking board 406 and, in response, the power subsystem 208 in the combined power/fan cooling system 200 that is located in the power/fan chassis slot 404*b* may switch from the secondary power subsystem to the primary power subsystem using any of a variety of primary/secondary power subsystem switchover techniques that would be apparent to one of skill in the art in possession of the present disclosure.

Furthermore, while the inability of the power subsystem 208 in the combined power/fan cooling system 200 that is located in the power/fan chassis slot 404*a* to provide power to the networking board 406 is illustrated in FIG. 11 as resulting from a lack of power being received via the external power source connectors 414*a*, one of skill in the art in possession of the present disclosure will appreciate how the power subsystem 208 in the combined power/fan cooling system 200 that is located in the power/fan chassis slot 404*a* may be unable to power the networking board 406 for a variety of reasons while remaining within the scope of the present disclosure as well. Furthermore, as discussed above, the fan devices 216 in the combined power/fan cooling system 200 that is located in the power/fan chassis slot 404*a* may be powered and controlled when its power subsystem 208 is unavailable (e.g., those fan devices 216 may be powered by the power subsystem 208 in the combined power/fan cooling system 200 that is located in the power/fan chassis slot 404*b* via a power connection between the two power subsystems 208 in the networking device 400, not illustrated) while remaining within the scope of the present disclosure as well.

Figure 12:
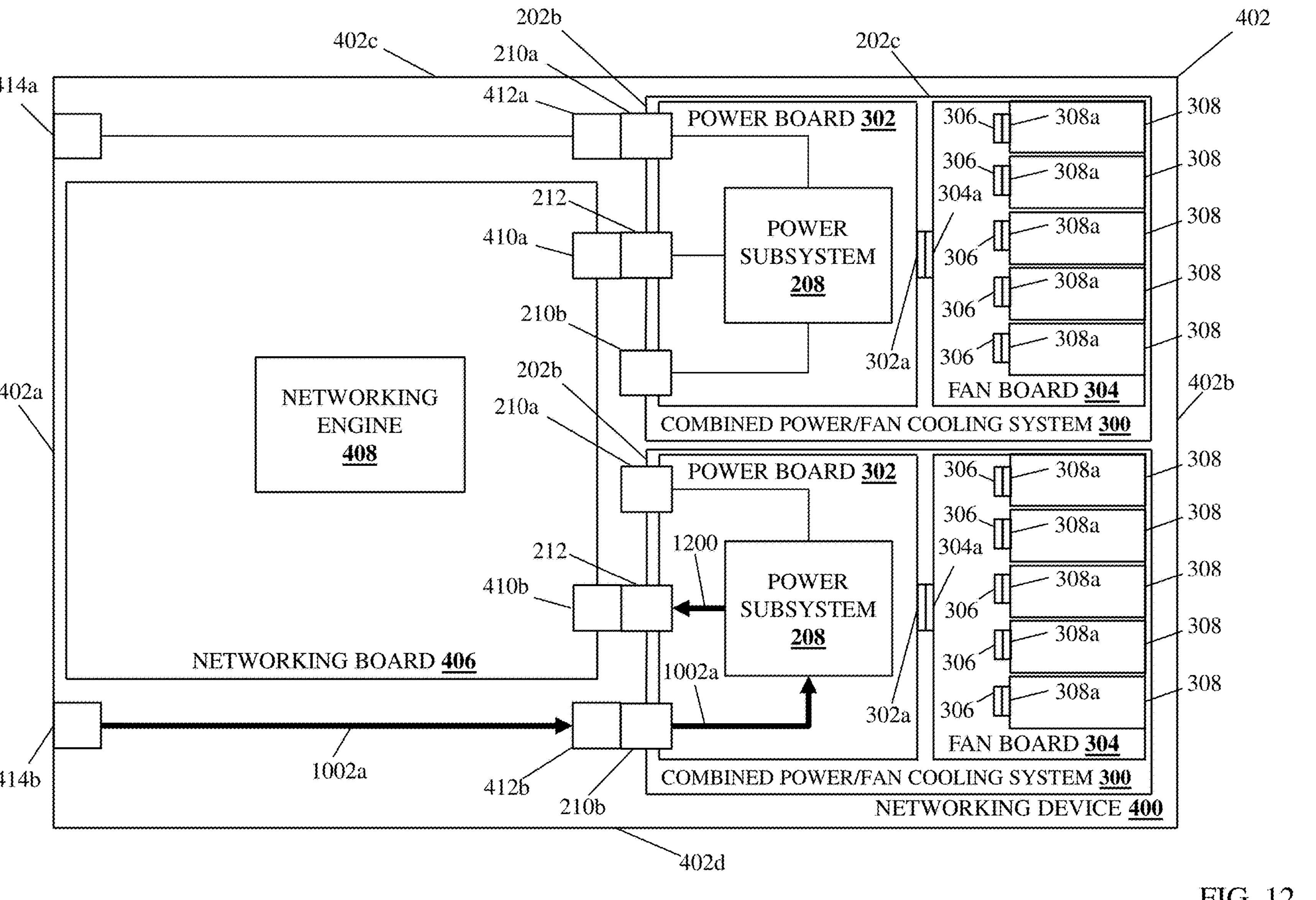
FIG. 12 is a schematic view illustrating an embodiment of the networking device and combined power/fan cooling systems of FIG. 8 operating during the method of FIG. 5.

With reference to FIG. 12, in an embodiment of block 510, the power subsystem 208 in the combined power/fan cooling system 300 that is located in the power/fan chassis slot 404*a* may be unable to provide power to the networking board 406 and, in response, the power subsystem 208 in the combined power/fan cooling system 300 that is located in the power/fan chassis slot 404*b* may switch from the secondary power subsystem to the primary power subsystem using any of a variety of primary/secondary power subsystem switchover techniques that would be apparent to one of skill in the art in possession of the present disclosure.

Furthermore, while the inability of the power subsystem 208 in the combined power/fan cooling system 300 that is located in the power/fan chassis slot 404*a* to provide power to the networking board 406 is illustrated in FIG. 12 as resulting from a lack of power being received via the external power source connectors 414*a*, one of skill in the art in possession of the present disclosure will appreciate how the power subsystem 208 in the combined power/fan cooling system 300 that is located in the power/fan chassis slot 404*a* may be unable to power the networking board 406 for a variety of reasons while remaining within the scope of the present disclosure as well. Furthermore, as discussed above, the fan devices 308 in the combined power/fan cooling system 300 that is located in the power/fan chassis slot 404*a* may be powered and controlled when its power subsystem 208 is unavailable (e.g., those fan devices 308 may be powered by the power subsystem 208 in the combined power/fan cooling system 300 that is located in the power/fan chassis slot 404*b* via a power connection between the two power subsystems 208 in the networking device 400, not illustrated) while remaining within the scope of the present disclosure as well.

In response to unavailability of one of the power subsystems in the combined power/fan cooling systems in a networking device, that power subsystem may required replacement, and one of skill in the art in possession of the present disclosure will appreciate how the loss of cooling associated with the replacement of that power subsystem may require that replacement to be performed within some maximum time window (e.g., 60 seconds) if the networking device 400 remains operating.

The method 500 then returns to block 506. As such, with reference back to FIG. 11, at block 506 the power subsystem 208 in the combined power/fan cooling system 200 that is located in the power/fan chassis slot 404*b* may perform power provisioning operations 1100 that include providing the power received at block 504 via the component connector 212 and the component connector 410*b* to the networking board 406, which one of skill in the art in possession of the present disclosure will appreciate may cause that power to be provided to any networking components included on and/or coupled to the networking board 406 (e.g., the processing system and the memory system that provide the networking engine 408, ports mounted to the networking board 406 and accessible on the front wall 402*a* of the networking device chassis 402, as well as any other networking components that would be apparent to one of skill in the art in possession of the present disclosure.)

Similarly, with reference back to FIG. 12, at block 506 the power subsystem 208 in the combined power/fan cooling system 300 that is located in the power/fan chassis slot 404*b* may perform power provisioning operations 1200 that include providing the power received at block 504 via the component connector 212 and the component connector 410*b* to the networking board 406, which one of skill in the art in possession of the present disclosure will appreciate may cause that power to be provided to any networking components included on and/or coupled to the networking board 406 (e.g., the processing system and the memory system that provide the networking engine 408, ports mounted to the networking board 406 and accessible on the front wall 402*a* of the networking device chassis 402, as well as any other networking components that would be apparent to one of skill in the art in possession of the present disclosure.)

If, at decision block 506, the primary power subsystem is available, the method 500 proceeds to block 512 where fan devices in one or more fan subsystems in the power/fan chassis generate one or more airflows past one or more power subsystems and the one or more components in the computing device. As will be appreciated by one of skill in the art in possession of the present disclosure, in an embodiment of block 512 and with reference back to FIG. 7A, any or all the fan devices 216 on the combined power/fan cooling systems 200 in the power/fan chassis slots 404*a* and 404*b* may be controlled (e.g., by a fan control system on the networking board 406 and via the component connectors 410*a* and 410*b*, the component connectors 212, the power/fan boards 206, the board connectors 214, and the fan connectors 216*a*) to generate an airflow from outside the networking device chassis 402 (e.g., via the airflow apertures 216*b* on the fan devices 216), through the networking device chassis 402, and out of the front wall 402*a* of the networking device chassis 402.

Similarly, in an embodiment of block 512 and with reference back to FIG. 8, any or all the fan devices 308 on the combined power/fan cooling systems 200 in the power/fan chassis slots 404*a* and 404*b* may be controlled (e.g., by a fan control system on the networking board 406 and via the component connectors 410*a* and 410*b*, the component connectors 212, the power boards 302, the power board connectors 302*a*, the fan board connectors 304*a*, the fan boards 304, the board connectors 306, and the fan connectors 308*a*) to generate an airflow from outside the networking device chassis 402 (e.g., via airflow apertures on the fan devices 308 that are similar to the airflow apertures 216*b* on the fan devices 216 illustrated and discussed above), through the networking device chassis 402, and out of the front wall 402*a* of the networking device chassis 402.

The method 500 then proceeds to decision block 514 where the method 500 proceeds depending whether a fan device replacement is required. In an embodiment, at decision block 514, any of the fan devices 216 in the combined power/fan cooling systems 200 or the fan devices 308 in the combined power/fan cooling systems 300 may require replacement due to their failure or other inability to generate the airflow discussed above, due to a desire to upgrade the fan device(s), and/or in a variety of other fan device replacement scenarios that would be apparent to one of skill in the art in possession of the present disclosure. If, at decision block 514, a fan device replacement is not required, the method 500 returns to block 504. As such, the method 500 may loop to perform the operations described above as long as none of the fan devices provided in the combined power/fan cooling systems require replacement.

Figure 13:
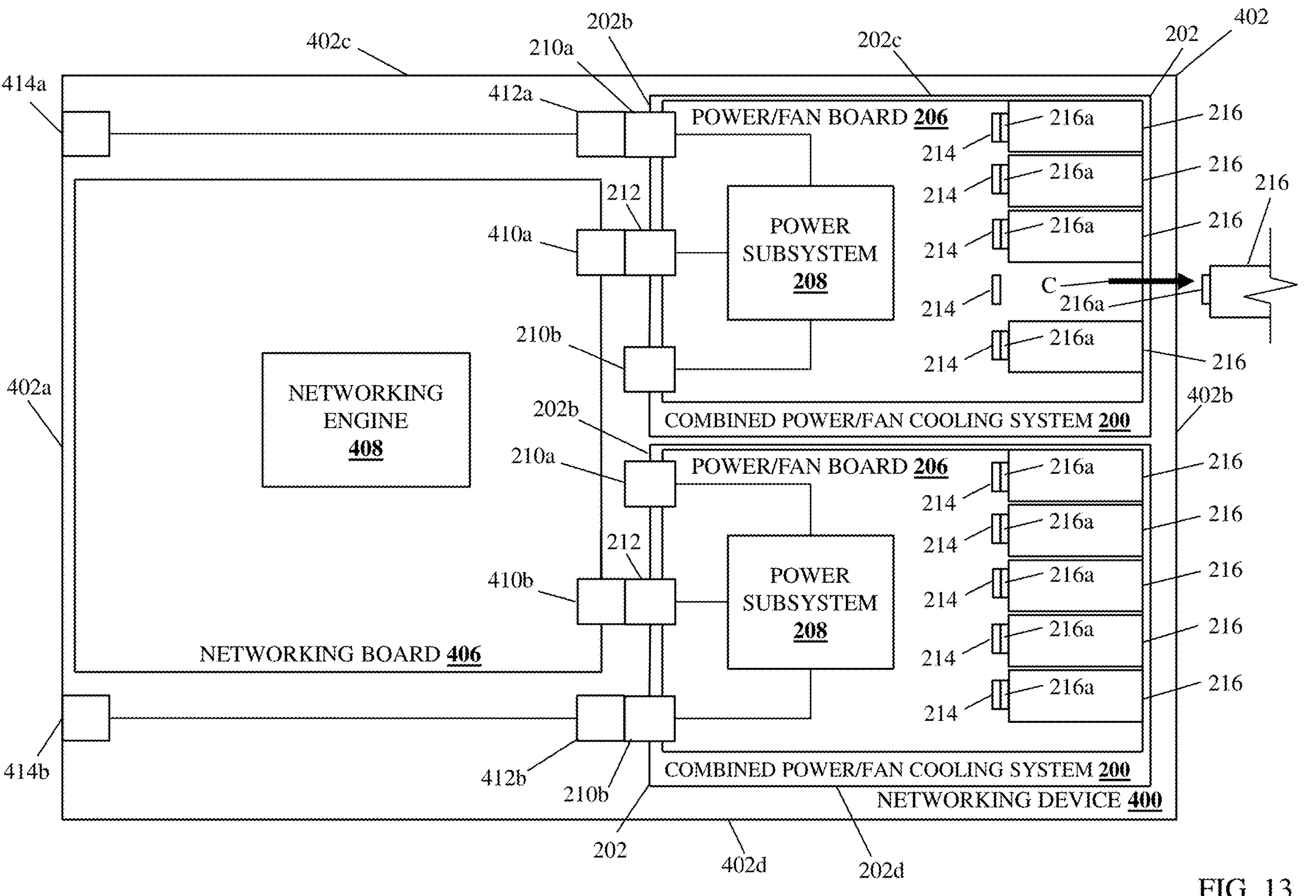
FIG. 13 is a schematic view illustrating an embodiment of a fan device being removed from the networking device and combined power/fan cooling systems of FIGS. 7A-7B during the method of FIG. 5.

If, at decision block 514, a fan device replacement is required, the method 500 proceeds to block 516 where one or more fan devices are disconnected from the power subsystem in their power/fan chassis while that power subsystem provides power to the one or more components in the computing device. With reference to FIG. 13, in an embodiment of block 516, a fan device 216 (e.g., the "fourth" fan device from the side surface 202*c* on the power/fan chassis 202 of the combined power/fan cooling system 200 in the power/fan chassis slot 404*a* in the illustrated example) may require replacement at decision block 514 and, in response, that fan device 216 may be moved in a direction C to disconnect its fan connector 216*a* from the corresponding board connector 214 on the power/fan board 206 and move that fan device 216 out of that power/fan chassis 202 and the networking device chassis 402.

As will be appreciated by one of skill in the art in possession of the present disclosure, the power subsystem 208 of the combined power/fan cooling system 200 in the power/fan chassis slot 404*a* may continue to provide power to the networking engine 408 as described above with reference to FIG. 9 (i.e., when that power subsystem 208 continues to operate as the primary power subsystem as described above) while the fan device 216 is disconnected from it, thus providing for the "hot-removal" of that fan device 216 from the combined power/fan cooling system 200 and the networking device 400. Furthermore, one of skill in the art in possession of the present disclosure will appreciate how any of the fan devices 216 on either of the combined power/fan cooling systems 200 in the power/fan chassis slots 404*a* and 404*b* may be "hot-removed" in a similar manner while remaining within the scope of the present disclosure as well.

Figure 14:
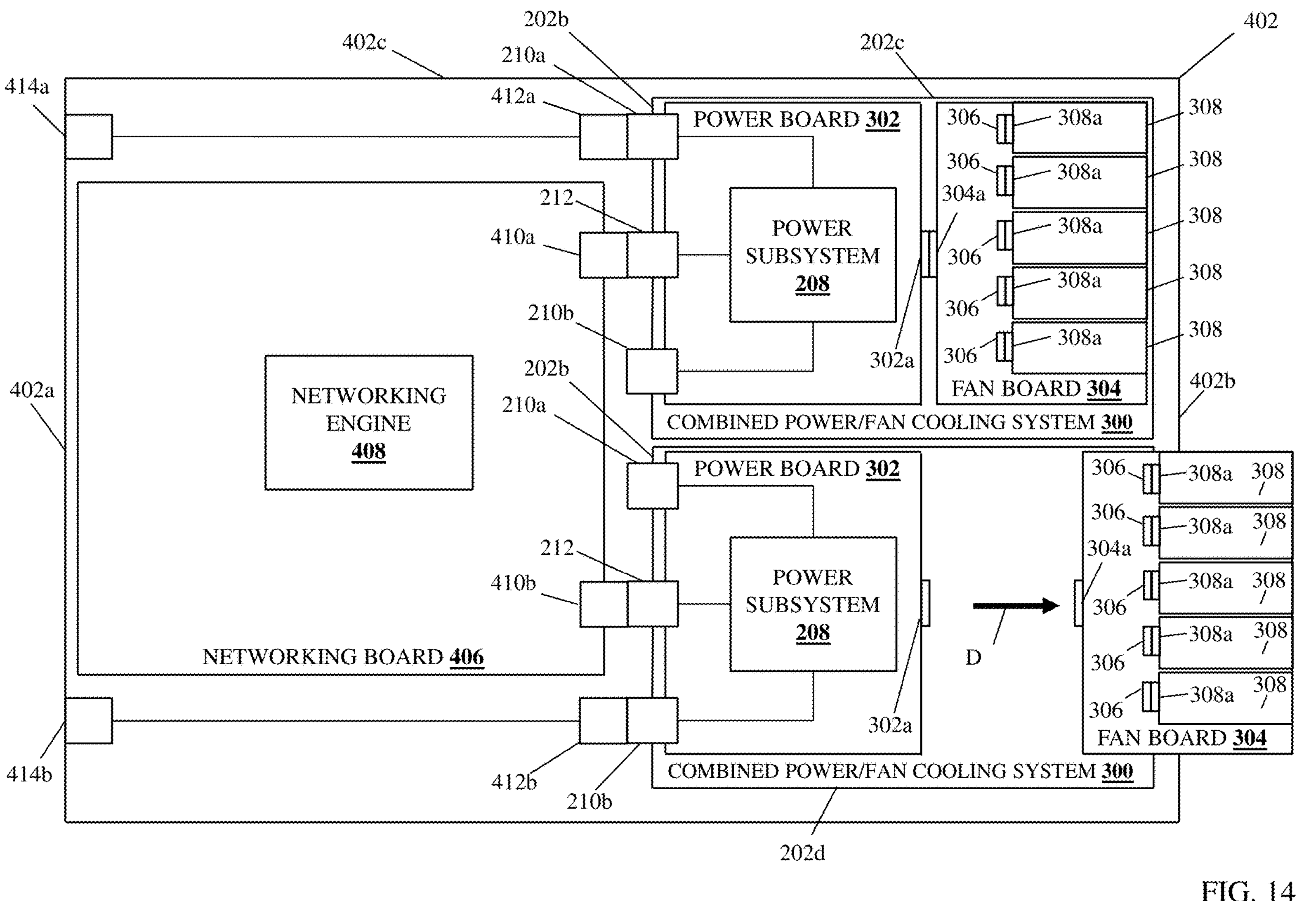
FIG. 14 is a schematic view illustrating an embodiment of the combined power/fan cooling system being removed from the networking device and combined power/fan cooling systems of FIG. 8 during the method of FIG. 5.

With reference to FIG. 14, in an embodiment of block 516, any of the fan devices 308 (e.g., one or more fan devices 216 of the combined power/fan cooling system 300 in the power/fan chassis slot 404*b* in the illustrated example) may require replacement at decision block 514 and, in response, the fan board 304 on that combined power/fan cooling system 300 may be moved in a direction D to disconnect its fan board connector 304*a* from the corresponding power board connector 302*a* on the power board 302 and move that fan board 304 out of that power/fan chassis 202 and the networking device chassis 402. As will be appreciated by one of skill in the art in possession of the present disclosure, the power subsystem 208 of the combined power/fan cooling system 300 in the power/fan chassis slot 404*b* may continue to provide power to the networking engine 408 as described above with reference to FIG. 12 (i.e., when that power subsystem 208 continues to operate as the primary power subsystem as described above) while the fan board 304 is disconnected from it, thus providing for the "hot-removal" of that fan board 304 and its fan devices 308 from the combined power/fan cooling system 300 and the networking device 400. Similarly as discussed above, one of skill in the art in possession of the present disclosure will appreciate how the loss of cooling associated with the removal of the fan board 304 may require that the fan board be replaced within some maximum time window (e.g., 60 seconds) if the networking device 400 remains operating. Furthermore, one of skill in the art in possession of the present disclosure will appreciate how the fan board 304 of the combined power/fan cooling systems 300 in the power/fan chassis slot 404*a* may be "hot-removed" in a similar manner while remaining within the scope of the present disclosure as well.

However, while the fan board 304 on the combined power/fan cooling system 300 is described as being removed from that combined power/fan cooling system 300 and the networking device 400 in the event one or more of its fan devices 308 require replacement, in embodiments in which each of the fan devices 308 is separately connectable/disconnectable from the fan board 304 via the board connectors 306, any of those fan devices 308 may be separately "hot-removed" from the fan board 304 similarly as described above for the fan devices 216 and combined power/fan cooling systems 200 while remaining within the scope of the present disclosure as well.

The method 500 then proceeds to block 518 where one or more fan devices are connected to the power subsystem in the power/fan chassis while that power subsystem provides power to the one or more components in the computing device. With reference back to FIG. 13, in an embodiment of block 518, a fan device may be connected to the board connector 214 that had its fan device disconnected at block 516 (e.g., the "fourth" fan connector 214 from the side surface 202*c* on the power/fan chassis 202 of the combined power/fan cooling system 200 in the power/fan chassis slot 404*a* in the illustrated example) similarly as described above with reference to FIG. 2B, and one of skill in the art in possession of the present disclosure will appreciate how the power subsystem 208 of the combined power/fan cooling system 200 in the power/fan chassis slot 404*a* may continue to provide power to the networking engine 408 as described above with reference to FIG. 9 (i.e., when that power subsystem 208 continues to operate as the primary power subsystem as described above) while that fan device is connected to it, thus providing for the "hot-addition" of that fan device to the fan subsystem, the combined power/fan cooling system 200, and the networking device 400, and a "hot-swap" of fan devices at blocks 516 and 518 of the method 500. Furthermore, one of skill in the art in possession of the present disclosure will appreciate how fan devices may be "hot-added" to either of the combined power/fan cooling systems 200 in the power/fan chassis slots 404*a* and 404*b* in a similar manner while remaining within the scope of the present disclosure as well.

With reference back to FIG. 14, in an embodiment of block 518, any of the fan device(s) 308 that require replacement may be disconnected from their board connector(s) 306 on the fan board 304 that was disconnected at block 516, and replacement fan devices may then be connected to those board connector(s) 306. That fan board 304 (with the replacement fan devices connected) may then be connected to the power board 302 of the combined power/fan cooling system 300 in the power/fan chassis slot 404*b* similarly as described above with reference to FIG. 3B, and one of skill in the art in possession of the present disclosure will appreciate how the power subsystem 208 of the combined power/fan cooling system 300 in the power/fan chassis slot 404*b* may continue to provide power to the networking engine 408 as described above with reference to FIG. 12 (i.e., when that power subsystem 208 continues to operate as the primary power subsystem as described above) while that fan board 304 is connected to it, thus providing for the "hot-addition" of that fan board 304 and its fan devices to the combined power/fan cooling system 300 and the networking device 400, and a "hot-swap" of fan devices at blocks 516 and 518 of the method 500. Furthermore, one of skill in the art in possession of the present disclosure will appreciate how the fan board 304 and fan devices may be "hot-added" to the combined power/fan cooling system 300 in the power/fan chassis slot 404*a* in a similar manner while remaining within the scope of the present disclosure as well.

Furthermore, one of skill in the art in possession of the present disclosure will appreciate how the fan board 304 with the fan devices 308 (at least one that requires replacement at decision block 514) may be replaced with a replacement fan board having replacement fan devices in a similar manner to "hot-add" that fan board to the combined power/fan cooling system 300 and the networking device 400, and "hot-swap" of fan devices/fan boards at blocks 516 and 518 of the method 500.

Further still, while the fan board 304 on the combined power/fan cooling system 300 is described as being reconnected to that combined power/fan cooling system 300 and the networking device 400 in the event one or more of its fan devices 308 is replaced, in embodiments in which each of the fan devices 308 is separately connectable/disconnectable from the fan board 304 via the board connectors 306, replacement fan devices may be separately "hot-added" to the fan board 304 similarly as described above for the fan devices 216 and combined power/fan cooling systems 200 while remaining within the scope of the present disclosure as well. The method 500 then returns to block 504.

Thus, systems and methods have been described that provide a combined power/fan cooling system that includes a power subsystem that provides power for a computing device, as well as a fan subsystem with a plurality of "hot-swappable" fan devices that provide cooling for the power subsystem and the computing device. For example, the combined power/fan cooling system of the present disclosure may include a power/fan chassis that may be provided in a computing device. A power subsystem housed in the power/fan chassis receives power from a power source when the power/fan chassis is provided in the computing device, and provides the power to component(s) in the computing device. A fan subsystem located in the power/fan chassis adjacent the power subsystem includes fan devices that generate an airflow past the power subsystem and the component(s) in the computing device when the power/fan chassis is provided in the computing device. Each of the fan devices is also configured to be connected to, and disconnected from, the power subsystem while the power subsystem is providing the power to the component(s) in the computing device. As discussed below, the combined power/fan cooling systems of the present disclosure allows the provisioning of more fan devices in a computing device relative to conventional cooling systems, while also allowing fan devices that are used to cool the power subsystem to be "hot-swapped" and/or replaced in the event that they cease operating.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A combined power/fan cooling system, comprising:

a first power/fan chassis that is configured to be provided in a computing device;

a first power subsystem that is housed in the first power/fan chassis and that is configured to receive first power from a first power source when the first power/fan chassis is provided in the computing device, and provide the first power to at least one component in the computing device; and a first fan subsystem that is housed in the first power/fan chassis adjacent the first power subsystem and that includes a plurality of first fan devices that are each configured to generate a first airflow past the first power subsystem and the at least one component in the computing device when the first power/fan chassis is provided in the computing device, and wherein each of the plurality of first fan devices is configured to be connected to, and disconnected from, the first power subsystem while the first power subsystem is providing the first power to the at least one component in the computing device.

2. The system of claim 1, further comprising:

a first power/fan board that is housed in the first power/fan chassis and that supports the first power subsystem and first fan subsystem.

3. The system of claim 1, further comprising:

a first power board that is housed in the first power/fan chassis and that supports the first power subsystem; and a first fan board that that is housed in the first power/fan chassis and that supports the first fan subsystem, wherein the first fan board is configured to be connected to, and disconnected from, the first power board while the first power subsystem is providing the first power to the at least one component in the computing device.

4. The system of claim 1, wherein the plurality of fan devices includes at least five fan devices.

5. The system of claim 1, wherein the first power/fan chassis is configured to be provided in either of a first power/fan chassis slot or a second power/fan chassis slot included on the computing device in order to couple the first power subsystem to the first power source.

6. The system of claim 1, further comprising:

a second power/fan chassis that is configured to be provided in the computing device immediately adjacent the first power/fan chassis;

a second power subsystem that is housed in the second power/fan chassis and that is configured to receive second power from a second power source when the second power/fan chassis is provided in the computing device, and provide the second power to the at least one component in the computing device; and a second fan subsystem that is housed in the second power/fan chassis adjacent the second power subsystem and that includes a plurality of second fan devices that are each configured to generate a second airflow past the second power subsystem and the at least one component in the computing device when the second power/fan chassis is provided in the computing device, and where each of the plurality of second fan devices is configured to be connected to, and disconnected from, the second power subsystem while the second power subsystem is providing the second power to the at least one component in the computing device.

7. An Information Handling System (IHS), comprising:

a networking device chassis;

a processing system that is housed in the networking device chassis;

a memory system that is housed in the networking device chassis, that is coupled to the processing system, and that includes instructions that, when executed by the processing system, cause the processing system to provide a networking engine;

a first power/fan chassis that is housed in the networking device chassis;

a first power subsystem that is housed in the first power/fan chassis, that is coupled to a first power source via a first power source connector included in the networking device chassis, and that provides first power from the first power source to the processing system and the memory system; and a first fan subsystem that is housed in the first power/fan chassis adjacent the first power subsystem and that includes a plurality of first fan devices that are each configured to generate a first airflow past the first power subsystem, the processing system, and the memory system, and wherein each of the plurality of first fan devices is configured to be connected to, and disconnected from, the first power subsystem while the first power subsystem is providing the first power to the processing system and the memory system.

8. The IHS of claim 7, further comprising:

a first power/fan board that is housed in the first power/fan chassis and that supports the first power subsystem and first fan subsystem.

9. The IHS of claim 7, further comprising:

a first power board that is housed in the first power/fan chassis and that supports the first power subsystem; and a first fan board that that is housed in the first power/fan chassis and that supports the first fan subsystem, wherein the first fan board is configured to be connected to, and disconnected from, the first power board while the first power subsystem is providing the first power to the processing system and the memory system.

10. The IHS of claim 7, wherein the plurality of fan devices includes at least five fan devices.

11. The IHS of claim 7, further comprising:

a first power/fan chassis slot and a second power/fan chassis slot that are included on the networking device chassis, wherein the first power/fan chassis is configured to be provided in either of the first power/fan chassis slot or the second power/fan chassis slot in order to couple the first power subsystem to the first power source.

12. The IHS of claim 7, further comprising:

a second power/fan chassis that is housed in the networking device chassis immediately adjacent the first power/fan chassis;

a second power subsystem that is housed in the second first power/fan chassis, that is coupled to a second power source via a second power source connector included in the networking device chassis, and that is configured to provide second power from the second power source to the processing system and the memory system; and a second fan subsystem that is housed in the second power/fan chassis adjacent the second power subsystem and that includes a plurality of second fan devices that are each configured to generate a second airflow past the second power subsystem, the processing system, and the memory system, and wherein each of the plurality of second fan devices is configured to be connected to, and disconnected from, the second power subsystem while the second power subsystem is providing the second power to the processing system and the memory system.

13. The IHS of claim 7, wherein the networking device chassis includes a first surface having a plurality of ports, the first fan subsystem in the first power/fan chassis is located immediately adjacent a second surface on the networking device chassis that is opposite the first surface, and the first power source connector is either accessible on the first surface of the networking device chassis, or accessible adjacent the second surface of the networking device chassis.

14. A method for powering and cooling a computing device, comprising:

coupling, by a first power/fan chassis, to a computing device;

receiving, by a first power subsystem that is housed in the first power/fan chassis, first power from a first power source via a first power connector in the computing device;

providing, by the first power subsystem, the first power to at least one component in the computing device;

generating, by a plurality of first fan devices in a first fan subsystem that is housed in the first power/fan chassis adjacent the first power subsystem, a first airflow past the first power subsystem and the at least one component in the computing device;

disconnecting, by one of the plurality of first fan devices, from the first power subsystem while the first power subsystem is providing the first power to the at least one component in the computing device; and connecting, by a second fan device, to the first power subsystem while the first power subsystem is providing the first power to the at least one component in the computing device in order to add the second fan device to the first fan subsystem.

15. The method of claim 14, further comprising:

supporting, by a first power/fan board that is housed in the first power/fan chassis, the first power subsystem and first fan subsystem.

16. The method of claim 14, further comprising:

supporting, by a first power board that is housed in the first power/fan chassis, the first power subsystem;

supporting, by a first fan board that that is housed in the first power/fan chassis, the first fan subsystem;

disconnecting, by the first fan board, from the first power board while the first power subsystem is providing the first power to the processing system and the memory system; and connecting, by the first fan board, to the first power board while the first power subsystem is providing the first power to the processing system and the memory system.

17. The method of claim 14, wherein the plurality of fan devices includes at least five fan devices.

18. The method of claim 14, wherein the first power/fan chassis coupled to one of a first power/fan chassis slot and a second power/fan chassis slot that are included on the networking device chassis in order to couple the first power subsystem to the first power source.

19. The method of claim 14, further comprising:

coupling, by a second power/fan chassis, to the computing device adjacent the first power/fan chassis;

receiving, by a second power subsystem that is housed in the second power/fan chassis, second power from a second power source via a second power connector in the computing device; and generating, by a plurality of third fan devices in a second fan subsystem that is housed in the second power/fan chassis adjacent the second power subsystem, a second airflow past the second power subsystem and the at least one component in the computing device.

20. The method of claim 19, further comprising:

providing, by the second power subsystem in response to an inability of the first power subsystem to provide the first power to the at least one component in the computing device, the second power to at least one component in the computing device;

disconnecting, by one of the plurality of third fan devices, from the second power subsystem while the second power subsystem is providing the second power to the at least one component in the computing device; and connecting, by a fourth fan device, to the second power subsystem while the second power subsystem is providing the second power to the at least one component in the computing device in order to add the fourth fan device to the second fan subsystem.

* * * * *